(12) United States Patent
Saxelby, Jr. et al.

(10) Patent No.: US 6,403,009 B1
(45) Date of Patent: Jun. 11, 2002

(54) CIRCUIT ENCAPSULATION

(75) Inventors: John R. Saxelby, Jr., Maynard, MA (US); Walter R. Hedlund, III, Hollis, NH (US)

(73) Assignee: VLT Corporation, San Antonio, TX (US)

( * ) Notice: Subject to any disclaimer, the term of this patent is extended or adjusted under 35 U.S.C. 154(b) by 0 days.

(21) Appl. No.: 09/337,581

(22) Filed: Jun. 22, 1999

Related U.S. Application Data

(60) Division of application No. 08/802,762, filed on Feb. 20, 1997, now Pat. No. 5,945,130, which is a continuation-in-part of application No. 08/340,162, filed on Nov. 15, 1994, now Pat. No. 5,728,600.

(51) Int. Cl.$^7$ .......................... B29C 45/02; B29C 45/14

(52) U.S. Cl. .......................... 264/272.15; 264/272.17; 264/275

(58) Field of Search .................... 264/266, 272.11, 264/272.14, 272.15, 272.17, 275, 276; 425/112, 116, 129.4, 544, 553

(56) References Cited

U.S. PATENT DOCUMENTS

| | | | |
|---|---|---|---|
| 2,669,753 A | 2/1954 | Hormann | 264/276 |
| 2,724,864 A | 11/1955 | Krotz | 264/276 |
| 2,937,409 A | 5/1960 | Cole | 264/276 |
| 3,238,287 A | 3/1966 | Chapman | 264/276 |
| 3,354,529 A | 11/1967 | James | 29/156.8 |
| 3,408,438 A | 10/1968 | Staunton | 264/252 |
| 3,539,675 A | 11/1970 | Hugill | 264/157 |
| 3,621,338 A | * 11/1971 | Rogers et al. | 317/101 CC |
| 3,683,241 A | * 8/1972 | Duncan | 317/234 |
| 3,737,729 A | * 6/1973 | Carney | 317/101 PH |
| 3,769,702 A | 11/1973 | Scarbrough | 29/627 |

(List continued on next page.)

FOREIGN PATENT DOCUMENTS

| | | | |
|---|---|---|---|
| DE | G 91 00 467.5 | 5/1992 | |
| DE | G 92 17 155.9 | 2/1993 | |
| EP | 0 577 484 A1 | 1/1994 | |
| JP | 53-124075 | 10/1978 | ............ 264/272.17 |
| JP | 55-118640 | 9/1980 | ............ 264/272.17 |
| JP | 60-30144 | 2/1985 | ................ 425/117 |
| JP | 60-76130 | 4/1985 | ................ 37/211 |
| JP | 61-156791 | * 7/1986 | |
| JP | 61-177762 | * 8/1986 | |
| JP | 61-193460 | 8/1986 | ................ 437/219 |
| JP | 61-272940 | 12/1986 | ................ 425/117 |
| JP | 61-292926 | 12/1986 | ............ 264/272.17 |
| JP | 62-32622 | 2/1987 | ................ 437/207 |
| JP | 62-193131 | 8/1987 | ................ 149/95 |
| JP | 63-7638 | 1/1988 | ............ 264/272.17 |
| JP | 63-28042 | 2/1988 | ............ 264/272.17 |
| JP | 63-119242 | 5/1988 | |
| JP | 63-172433 | 7/1988 | ............ 264/272.17 |
| JP | 1-161892 | 6/1989 | |
| JP | 4-23442 | 1/1992 | ................ 29/856 |
| JP | 4-83367 | * 3/1992 | |
| JP | 4-346260 | 12/1992 | |
| JP | 5-315385 | 11/1993 | ............ 264/272.17 |
| JP | 6-48851 | * 2/1994 | |
| JP | 6-90083 | * 3/1994 | |

OTHER PUBLICATIONS

Electronic Products, "Ball grid array package challenges quad flatpack", p. 19, Apr. 1993.

*Primary Examiner*—Angela Ortiz
(74) *Attorney, Agent, or Firm*—Fish & Richardson P.C.

(57) ABSTRACT

A circuit on a circuit board is encapsulated using a first mold section and a second mold section. The first mold section closes on one side of the board, and the first mold section has an exposed first conduit. The second mold section closes on another side of the board, and the second mold section has a second conduit for pushing molding compound into a mold cavity in at least one of the mold sections. The second conduit has a side opened to the first mold section when the first and section mold sections are closed on the circuit board. A piston extends through the first conduit to close the side of the second conduit.

19 Claims, 31 Drawing Sheets

U.S. PATENT DOCUMENTS

| | | | |
|---|---|---|---|
| 4,029,388 A | | 6/1977 | Knoll .................... 339/218 |
| 4,218,724 A | | 8/1980 | Kaufman .................... 361/395 |
| 4,336,009 A | | 6/1982 | Wolf .................... 425/116 |
| 4,400,762 A | * | 8/1983 | Bartley et al. .............. 361/402 |
| 4,528,749 A | | 7/1985 | Heft .................... 29/858 |
| 4,551,746 A | * | 11/1985 | Gilbert et al. ................ 357/74 |
| 4,551,747 A | * | 11/1985 | Gilbert et al. ................ 357/74 |
| 4,554,613 A | | 11/1985 | Kaufman .................... 361/386 |
| 4,615,857 A | | 10/1986 | Baird .................... 425/116 |
| 4,688,152 A | | 8/1987 | Chia .................... 361/408 |
| 4,691,265 A | | 9/1987 | Calver et al. ............... 361/386 |
| 4,724,283 A | * | 2/1988 | Shimada et al. ........... 174/68.5 |
| 4,724,514 A | | 2/1988 | Kaufman .................... 361/388 |
| 4,736,520 A | | 4/1988 | Morris .................... 29/827 |
| 4,740,414 A | | 4/1988 | Shaheen .................... 428/210 |
| 4,750,089 A | * | 6/1988 | Derryberry et al. ......... 361/388 |
| 4,750,092 A | | 6/1988 | Werther .................... 361/400 |
| 4,769,525 A | | 9/1988 | Leatham .................... 219/209 |
| 4,783,695 A | * | 11/1988 | Eichelberger et al. ........ 357/65 |
| 4,783,697 A | | 11/1988 | Benenati et al. .............. 357/80 |
| 4,823,234 A | | 4/1989 | Konishi et al. ............. 361/386 |
| 4,861,251 A | | 8/1989 | Moitzger .................... 425/116 |
| 4,868,349 A | | 9/1989 | Chia .................... 174/52.4 |
| 4,879,630 A | * | 11/1989 | Boucard et al. ............ 361/386 |
| 4,881,884 A | | 11/1989 | De'Ath .................... 425/117 |
| 4,899,257 A | | 2/1990 | Yamamoto .................... 361/395 |
| 4,918,811 A | * | 4/1990 | Eichelberger et al. ........ 29/840 |
| 4,933,042 A | | 6/1990 | Eichelberger et al. ...... 156/239 |
| 4,953,005 A | | 8/1990 | Carlson et al. ............... 357/80 |
| 5,019,946 A | | 5/1991 | Eichelberger et al. ...... 361/414 |
| 5,028,987 A | | 7/1991 | Neugebauer et al. ......... 357/80 |
| 5,206,986 A | | 5/1993 | Arai et al. .................... 29/840 |
| 5,326,243 A | | 7/1994 | Fierkens .................... 425/116 |
| 5,331,203 A | | 7/1994 | Wojnarowski et al. ...... 257/698 |
| 5,334,857 A | | 8/1994 | Mennitt et al. ................ 257/48 |
| 5,344,600 A | | 9/1994 | McShane et al. ........... 264/219 |
| 5,356,283 A | | 10/1994 | Hamada et al. ............. 425/544 |
| 5,365,403 A | | 11/1994 | Vinciarelli et al. ......... 361/707 |
| 5,375,322 A | | 12/1994 | Leeb .................... 29/846 |
| 5,395,226 A | | 3/1995 | Sakai et al. ................ 425/116 |
| 5,626,887 A | | 5/1997 | Chou et al. ................. 425/129 |
| 5,637,273 A | | 6/1997 | Goo .................... 264/272.15 |

* cited by examiner

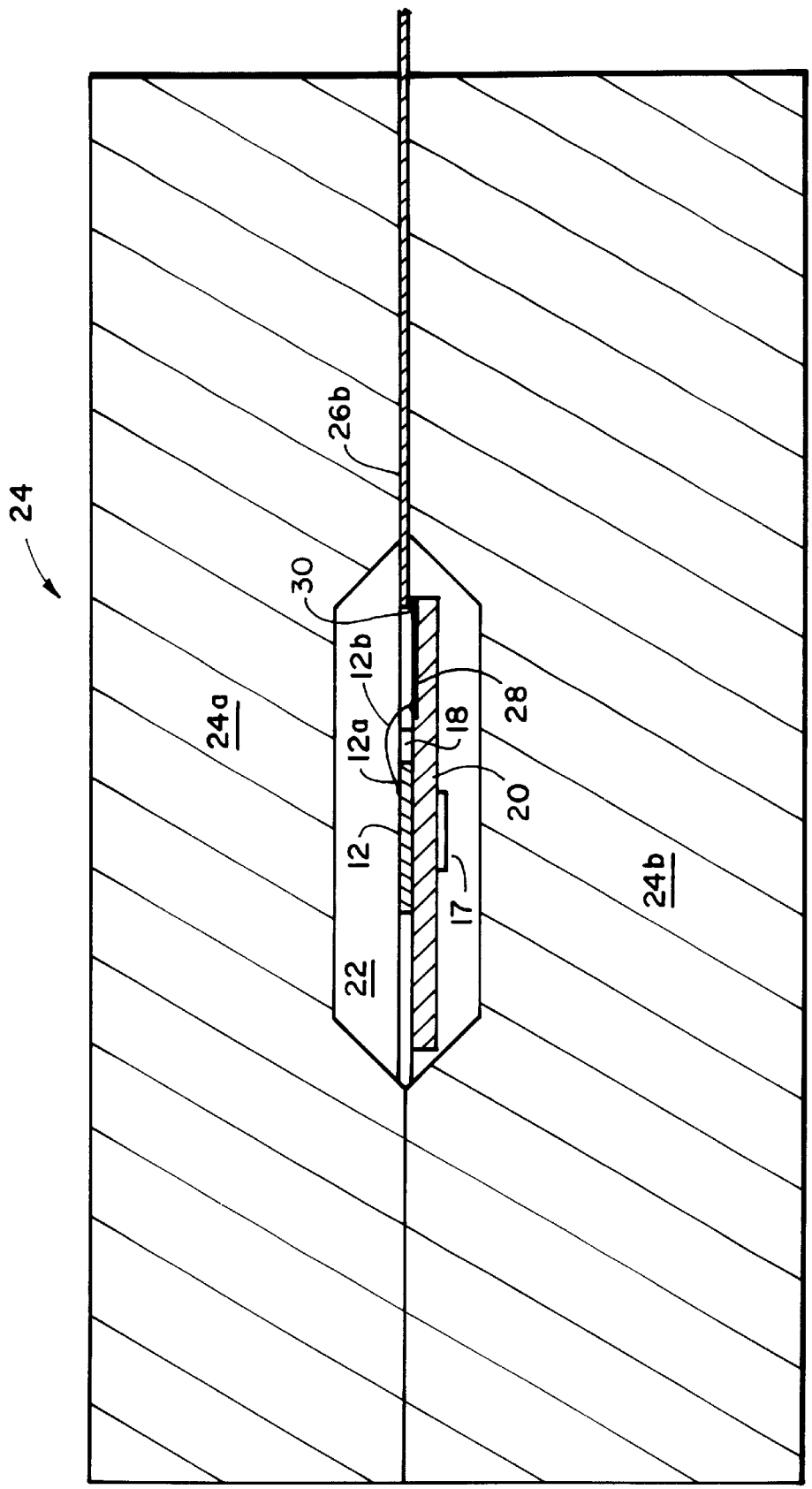

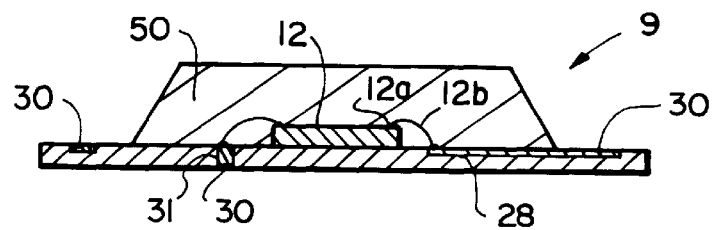
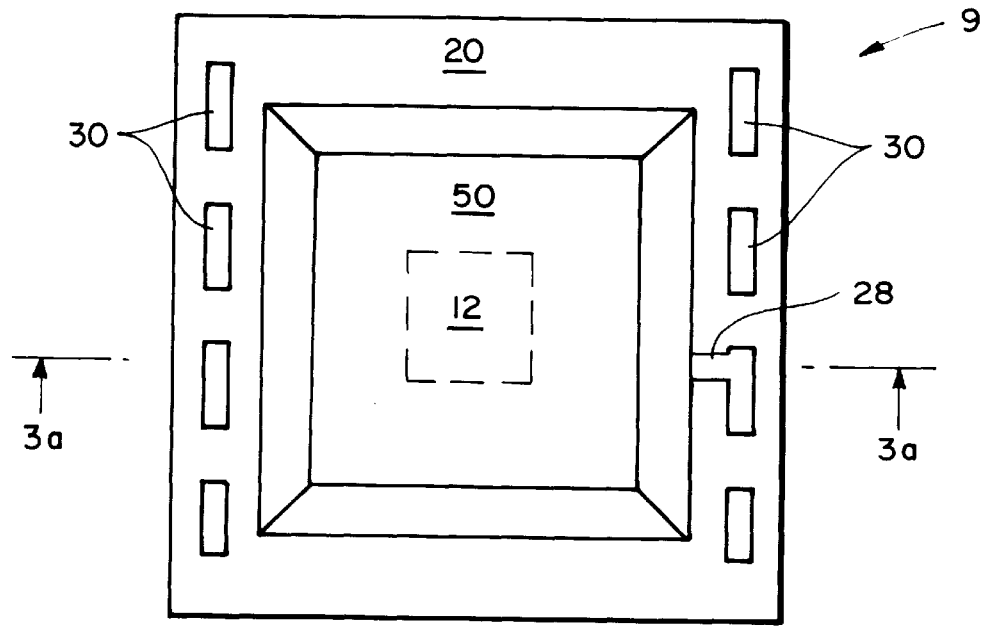
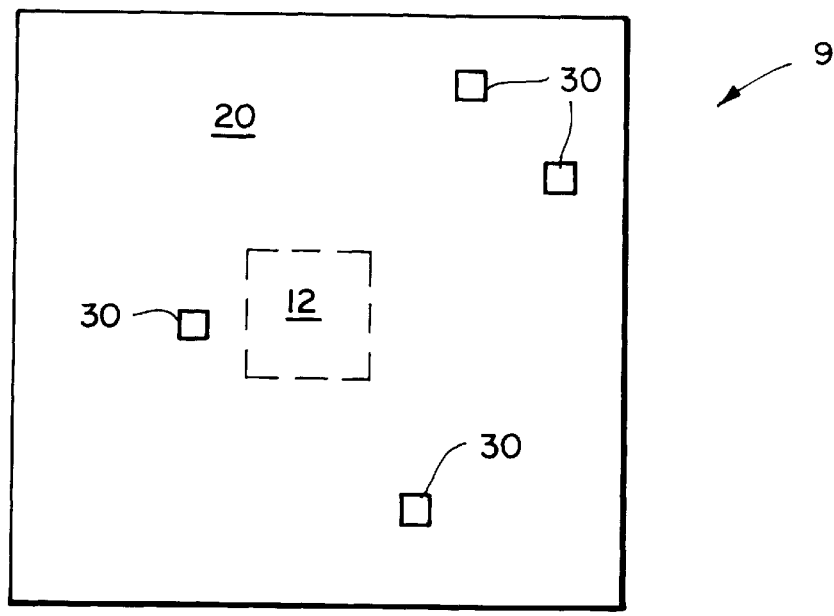

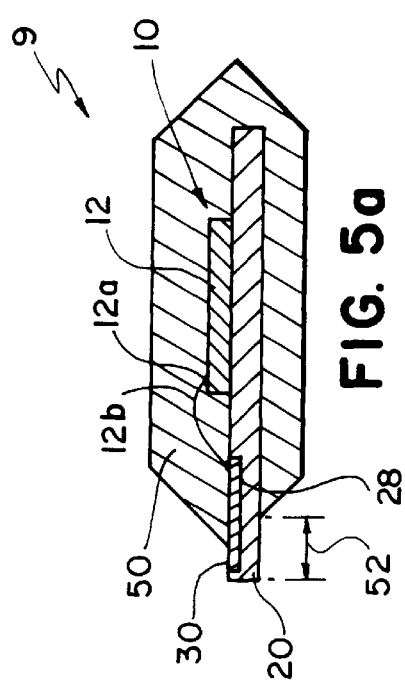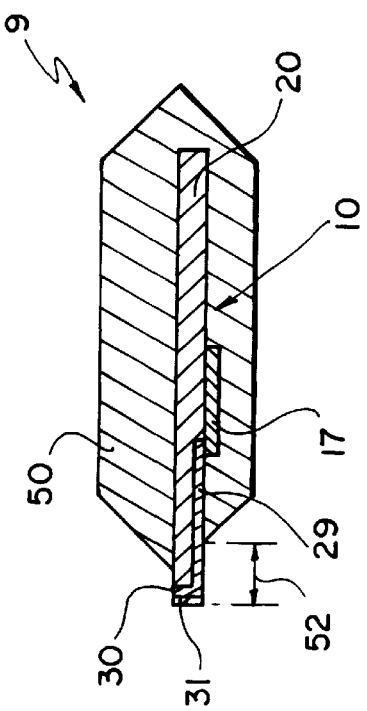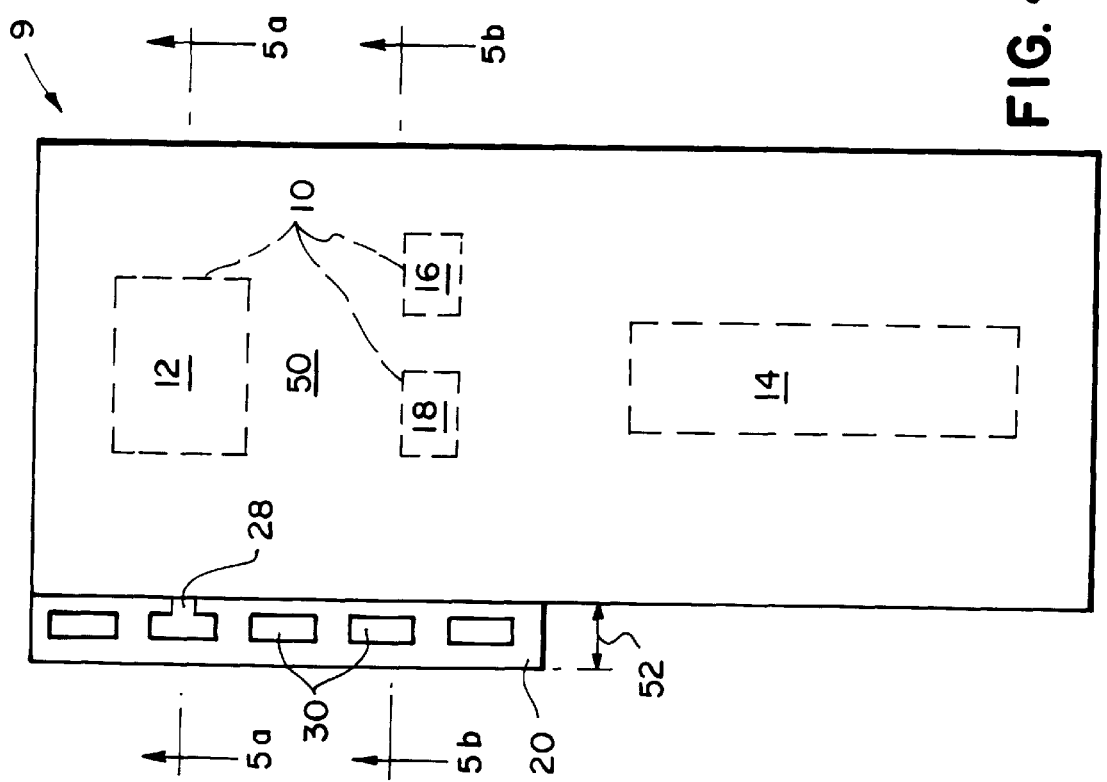

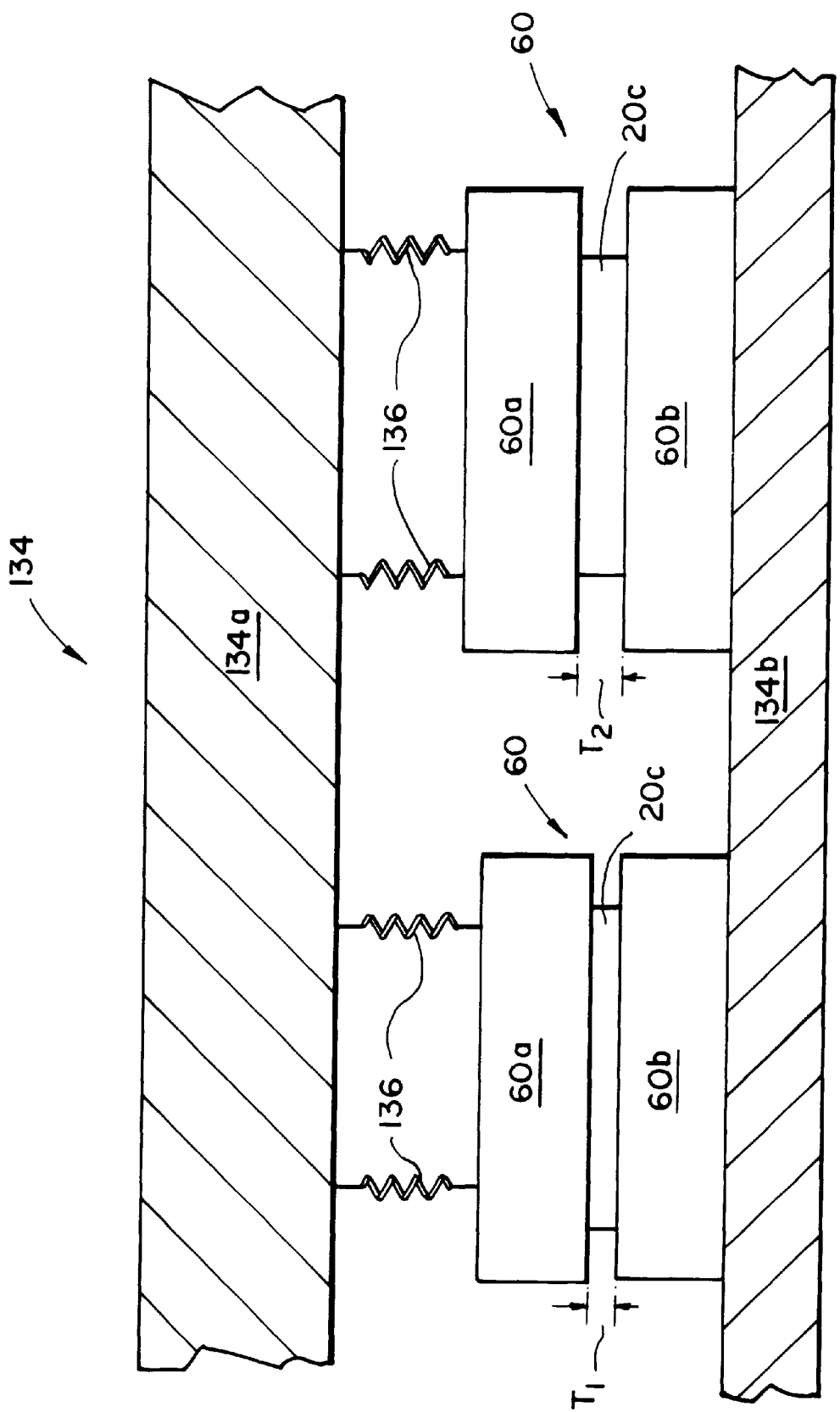

CIRCUIT ENCAPSULATION

This application is a divisional of application Ser. No. 08/802,762, filed Feb. 20, 1997, now U.S. Pat. No. 5,945,130 which is a continuation-in-part of application Ser. No. 08/340,162, filed Nov. 15, 1994, now issued as Pat. No. 5,728,600 on Mar. 17, 1998.

BACKGROUND

This invention relates to circuit encapsulation.

The circuit 10, shown in FIGS. 1a and 1b, for example, has integrated circuit dies (i.e., semiconductor dies) 12, and 14, and other electrical components 15, 16, 17, and 18 connected by a printed circuit board (PCB) 20. Encapsulation of circuit 10 is done within a mold cavity 22 of a mold 24 (FIGS. 2a–2e) using a molding compound 35. Connections to PCB 20 are made available externally to the molding compound by soldering conductive leads 26a, 26b, 26c, 26d, 26e, and 26f (FIGS. 1a, 1b) of metal lead frame 26 to input/output (I/O) pads 30 of PCB 20.

I/O pads 30 are also connected through conductive leads to the electrical components of circuit 10. For clarity, only conductive leads 28 (FIG. 1a) and 29 (FIG. 1b) are shown. Metal lead 26b is connected to an I/O pad 30 which is connected to conductive lead 28. A conductive pad 12a on semiconductor die 12 may be connected through wire 12b to conductive lead 28 (FIG. 2b) or a conductive pad (not shown) on a bottom side of die 12 could be connected to conductive lead 28. Metal lead 26f is connected to an I/O pad 30 which is connected by a plated through hole 31 (FIG. 2C) to conductive lead 29. A conductive pad (not shown) on a bottom side of electrical component 17 is directly connected to conductive lead 29.

Mold 24 has a top 24a and a bottom 24b that are closed on portions 26g and 26h (FIGS. 2a, 2d), and leads 26a, 26b, 26c, 26d, 26e and 26f (FIGS. 2b, 2c, 2e) of lead frame 26. Once mold 24 is closed, transfer molding is done by pushing molding compound 35, at 1000 psi, from a pot 36 (in mold bottom 24b), using a piston 40, into a runner 38 (also in mold bottom 24b) and into mold cavity 22 to surround circuit 10. After molding, circuit 10, encapsulated in cured molding compound, is removed from mold 24, and lead frame 26 is cut along dashed line 42 (FIGS. 1a, 1b), and waste molding compound is trimmed away along dashed line 43.

In one example, lead frame 26 has a thickness of approximately 0.008 inches with a tolerance of +/−0.00025 inches. When lead frame 26 is at a minimum thickness (i.e., 0.008−0.00025=0.00775), top 24a closes against bottom 24b, as shown in FIGS. 2a, 2b, 2c (i.e., they touch). The pressure of mold 24 on lead frame 26 does not damage lead frame 26. When lead frame 26 is at a maximum thickness (i.e., 0.008+0.00025=0.00825), top 24a does not close against bottom 24b leaving a gap 44, as shown in FIGS. 2d, 2e. The maximum height of gap 44 is 0.0005 inches (i.e., maximum thickness variance, 0.00025+0.00025=0.0005). Typical molding compounds will not leak, indicated by arrow 45, through a gap 44 of 0.0005 inches or less due to the viscosity of the molding compound.

Referring to FIGS. 3a, 3b, 3c, metal lead frame 26 (FIGS. 1a, 1b) is not needed to make external connections to I/O pads 30 of a component 9 because only a portion of one side of PCB 20 is encapsulated in cured molding compound 50 leaving I/O pads 30 exposed. Electrical components are generally not mounted in the exposed areas.

The thickness of PCB 20 is approximately 0.020 inches and has a tolerance of +/−0.0025 inches. The maximum thickness variation of 0.005 inches (i.e., 0.0025+0.0025=0.005) makes it difficult to use conventional molds to fully encapsulate circuit 10 (i.e., top, bottom, and sides) with the exception of I/O pads 30 (component 9, FIGS. 4, 5a, and 5b).

SUMMARY

In general, in one aspect, the invention features an apparatus for encapsulating a circuit on a circuit board. The apparatus has a first mold section configured to close on one side of the board. The first mold section has an exposed first conduit. The apparatus also has a second mold section configured to close on another side of the board. The second mold section has a second conduit for pushing molding compound into a mold cavity in at least one of the mold sections. The second conduit has a side opened to the first mold section when the first and section mold sections are closed on the board. The apparatus also has a piston slidably mounted inside the first conduit and configured to extend toward the second mold section to close the side of the second conduit.

Implementations of the invention may include one or more of the following. The board may include a portion that extends over the side of the second conduit, and the portion of the board is crushed by the piston. The piston may have a face configured to close the side of the second conduit and a rim extending from the face and configured to crush the portion of the board. The rim may be arcuate.

The second mold section may have a depression for receiving the board. The piston has a knife extending from a face, and the knife is configured to exert force on the board to seat the board against an end stop of the depression when the piston contacts the portion of the board. The depression may have another knife configured to exert force on the board to seat the board in the depression when the piston contacts the portion of the board. One or both of the knives may be asymmetric.

The second mold section may have a depression for receiving the board. The depression has a knife extending from the depression. The knife is configured to exert force on the board to seat the board in the depression when the piston contacts the portion of the board.

In another aspect, the invention features encapsulating a circuit on a circuit board. A first mold section is closed on a first mold section on one side of the board. The first mold section has an exposed first conduit. A second mold section is closed on another side of the board. The second mold section has a second conduit for pushing molding compound into a mold cavity in at least one of the mold sections. The second conduit has a side opened to the first mold section when the first and section mold sections are closed on the circuit board. A piston is extended through the first conduit to close the side of the second conduit.

Implementations of the invention may include one or more of the following. The board may partially extend over the side of the second circuit, and a portion of the board extending over the side of the second conduit is crushed by the piston. The piston may be used to exert lateral forces on the board to seat the board within the second mold section.

Advantages of the invention may include one or more of the following. Unused portions of the circuit board are minimized. A tight seal is formed between the mold sections and the circuit board. Tolerances in the thickness of the circuit board are accomodated.

A variety of other advantages and features will become apparent from the following description and from the claims.

DESCRIPTION

FIGS. 1a and 1b are plan views of a top and a bottom, respectively, of a circuit connected to a metal lead frame.

FIGS. 2a, 2b, 2c, 2d, and 2e are cross-sectional side views of the structure of FIGS. 1a and 1b inserted within a mold.

FIG. 3a is a cross-sectional side view of a circuit having a portion of one side of a substrate encapsulated in molding compound.

FIGS. 3b and 3c are top and bottom plan views, respectively, of the circuit of FIG. 3a.

FIG. 4 is a cross-sectional side view of a circuit having a portion of a top, a bottom, and sides of a substrate encapsulated in molding compound.

FIGS. 5a and 5b are cross-sectional side views of the structure of FIG. 4.

Figure 6A:
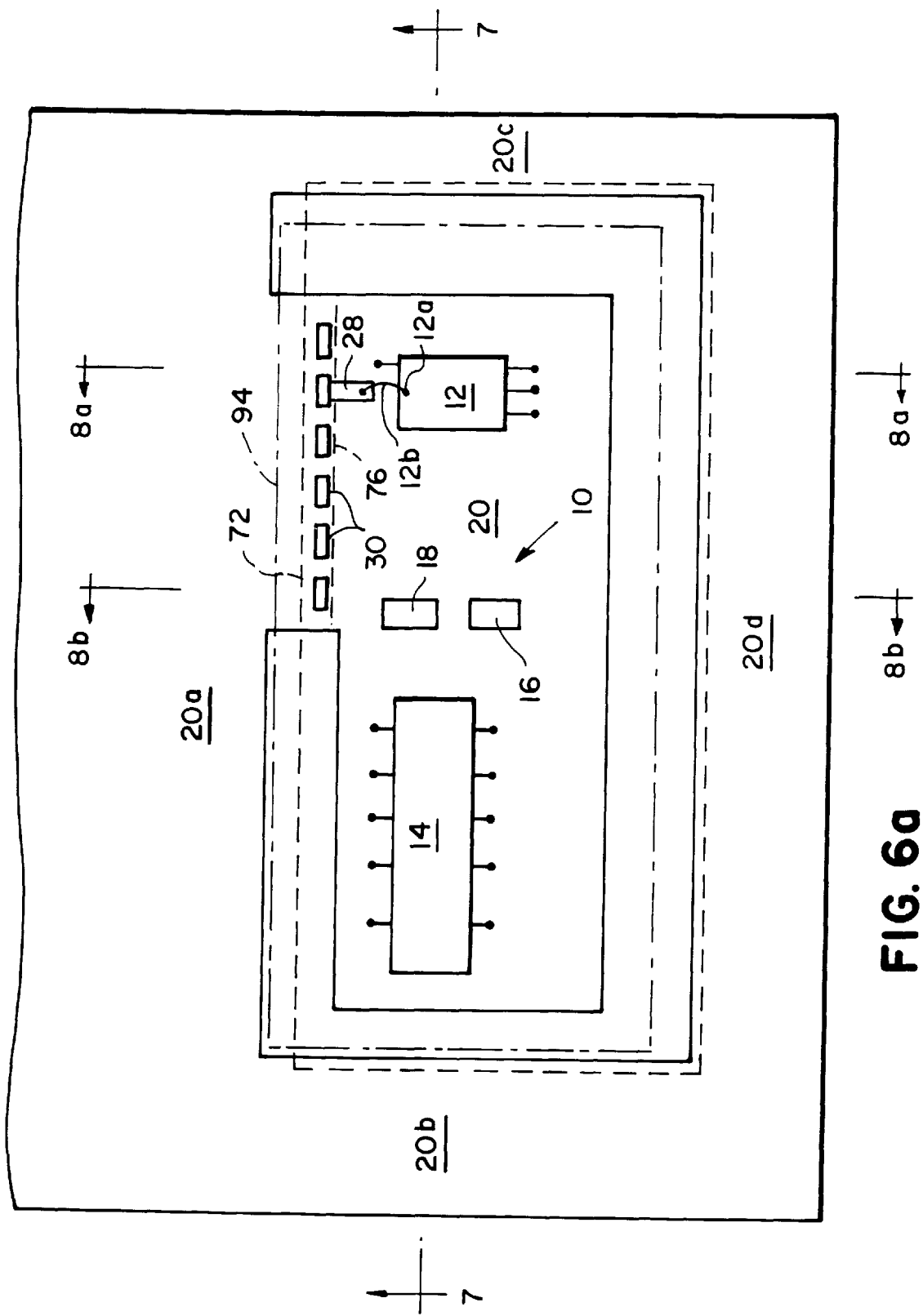
FIGS. 6a and 6b are plans of the unencapsulated circuit of FIG. 4.
Figure 6B:
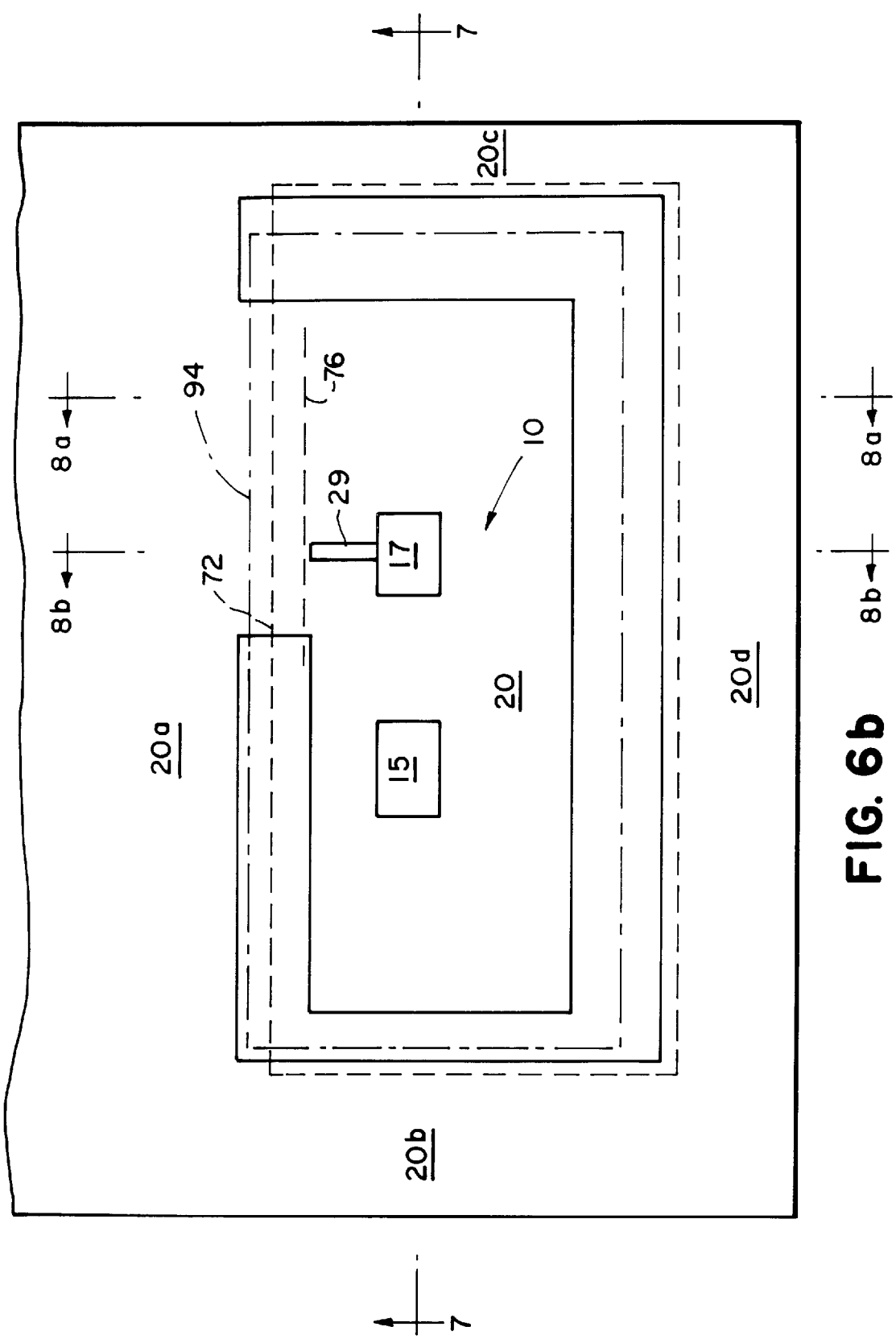
Figure 7:
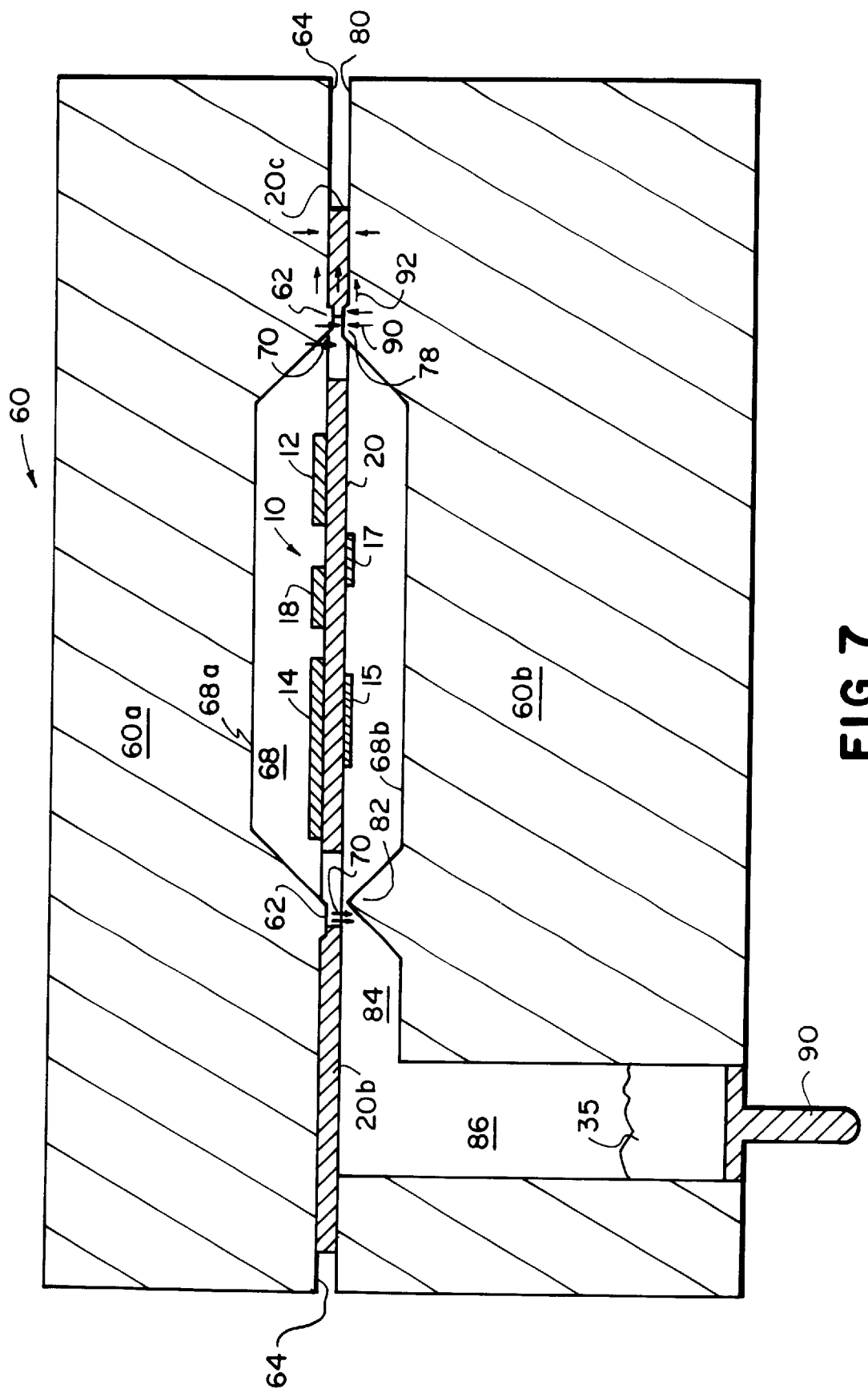

FIGS. 7, 8a, 8b, and 9 are cross-sectional side views of the circuit of FIGS. 6a and 6b inserted in a mold.

Figure 8A:
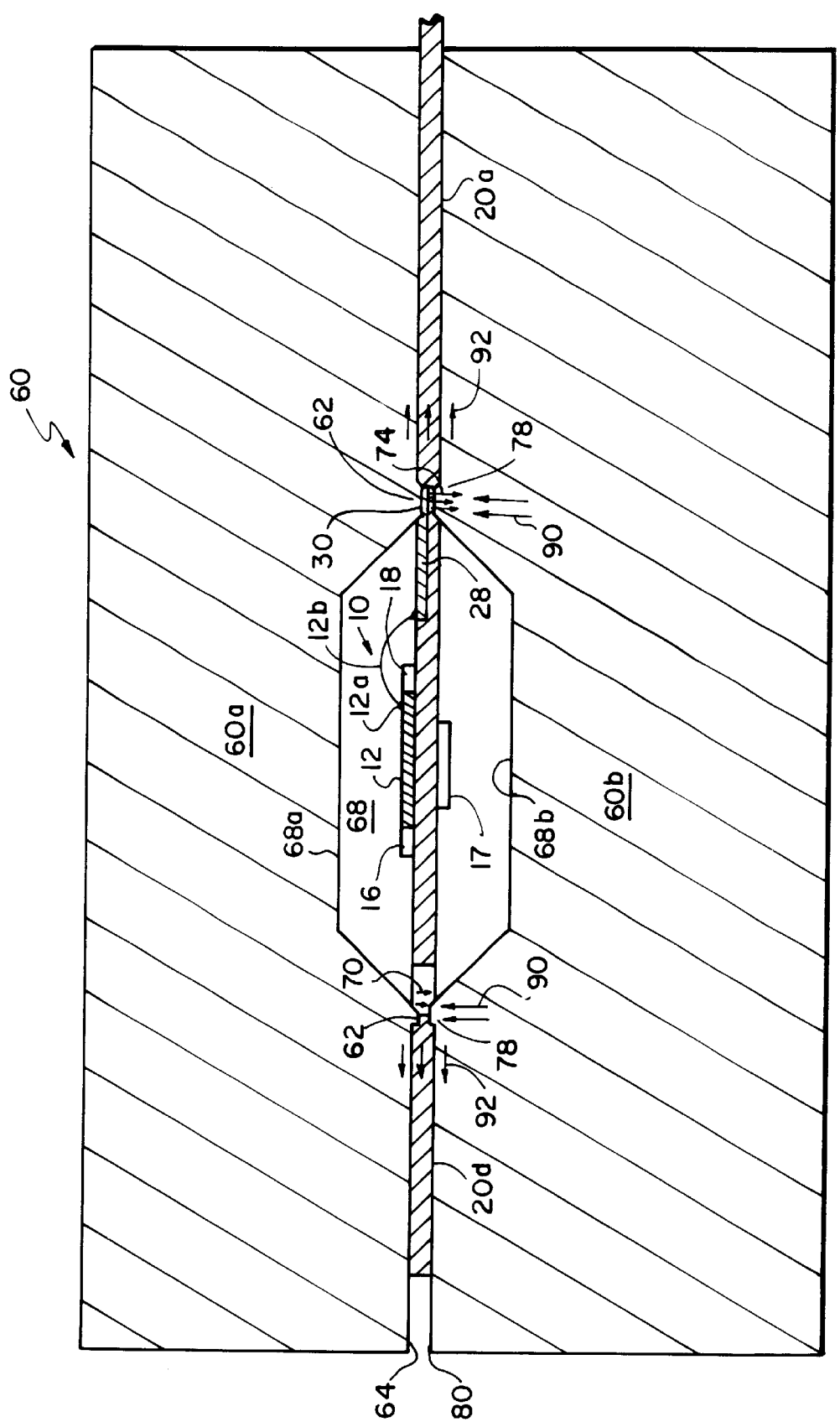
Figure 8B:
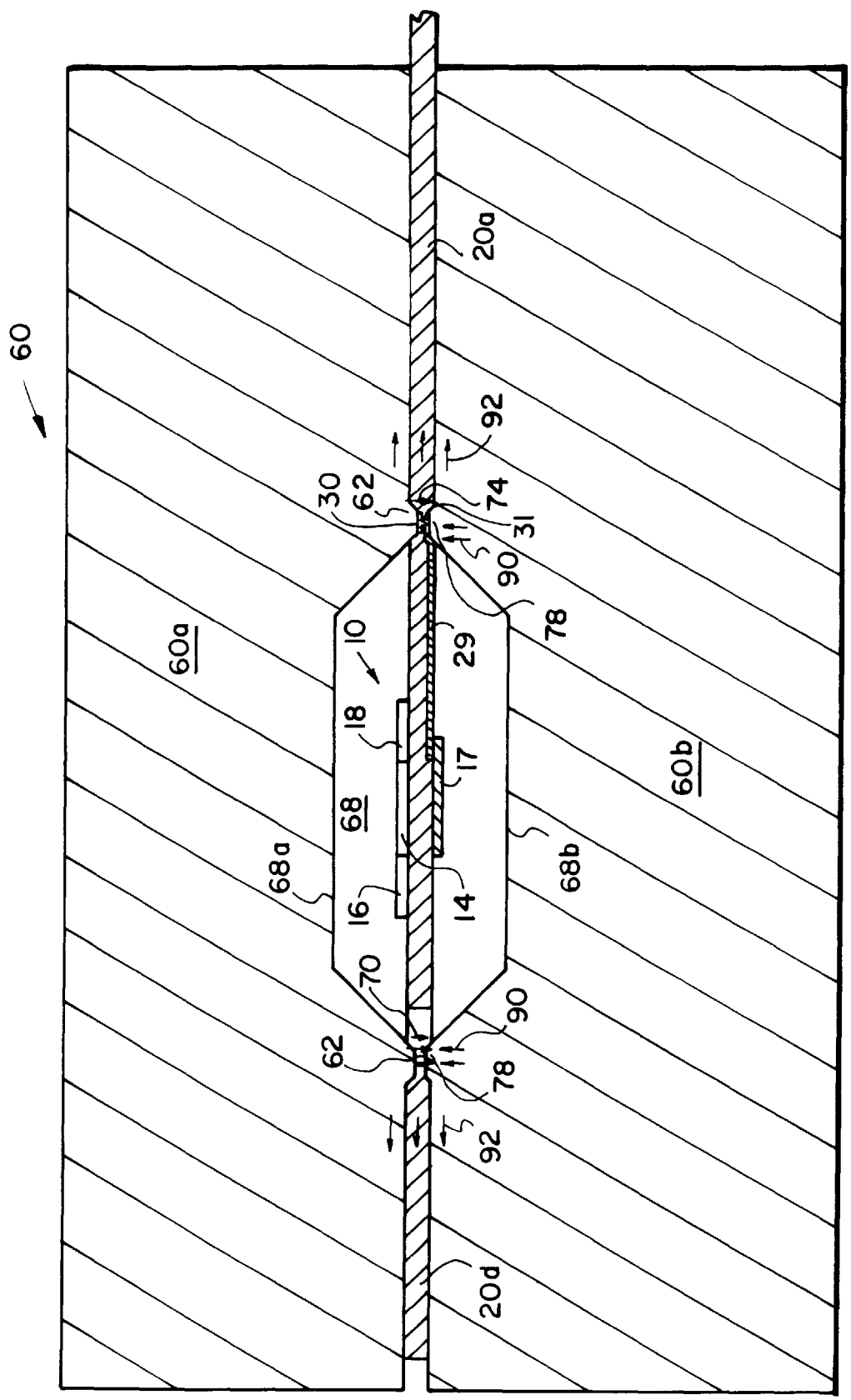
Figure 9:
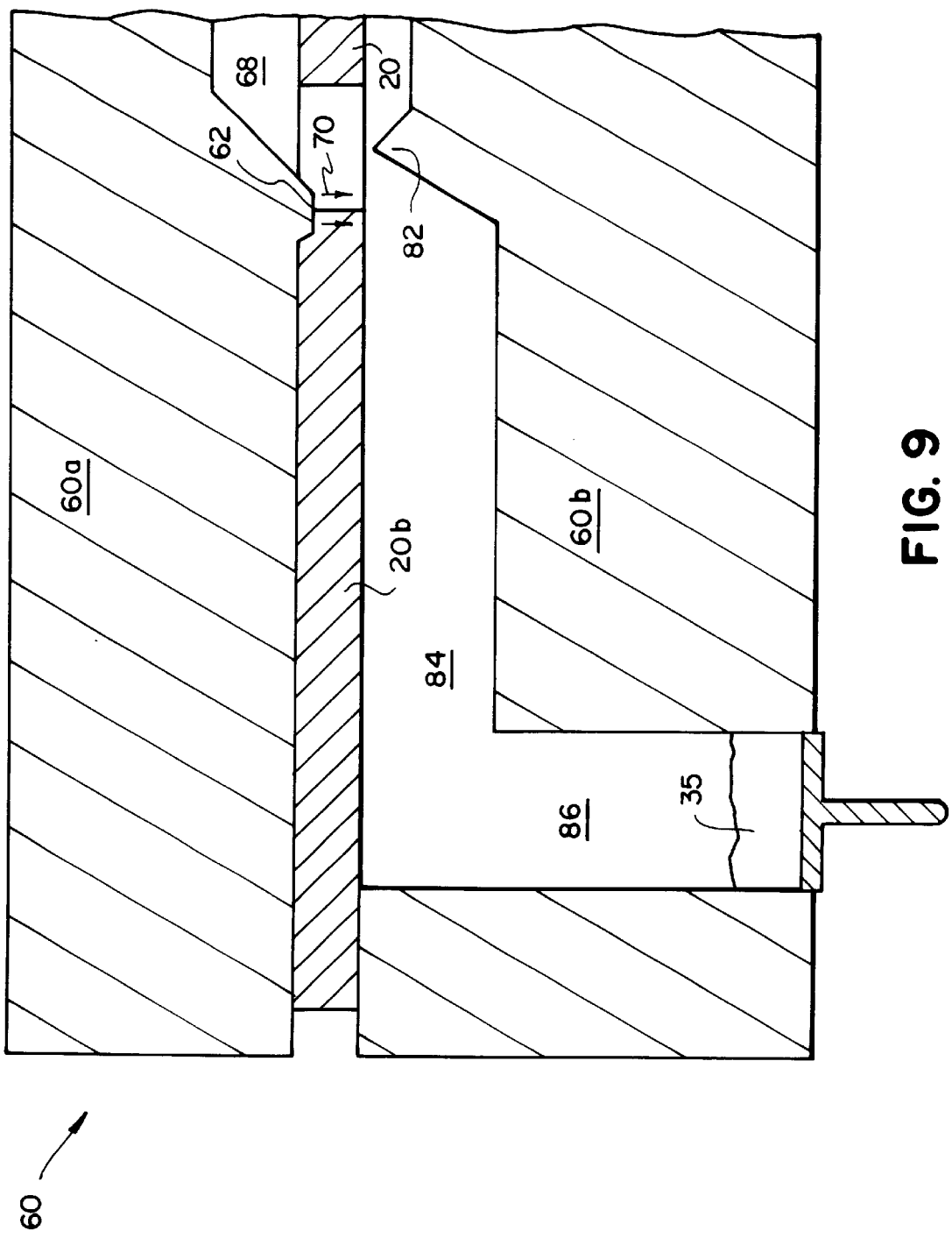
Figure 10:
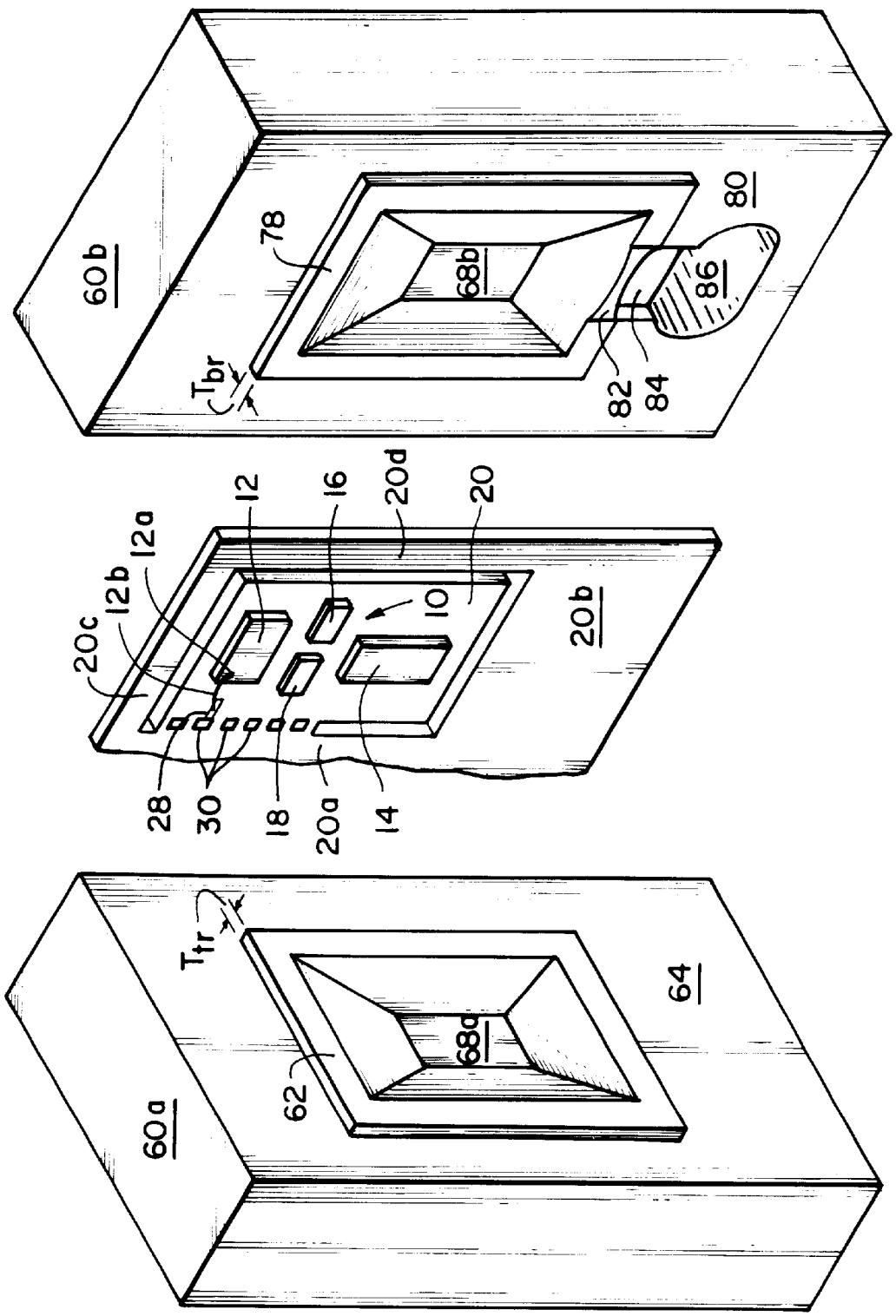

FIG. 10 is an exploded perspective view of the circuit of FIGS. 6a and 6b and the mold of FIGS. 7, 8a, 8b, and 9.

Figure 11:
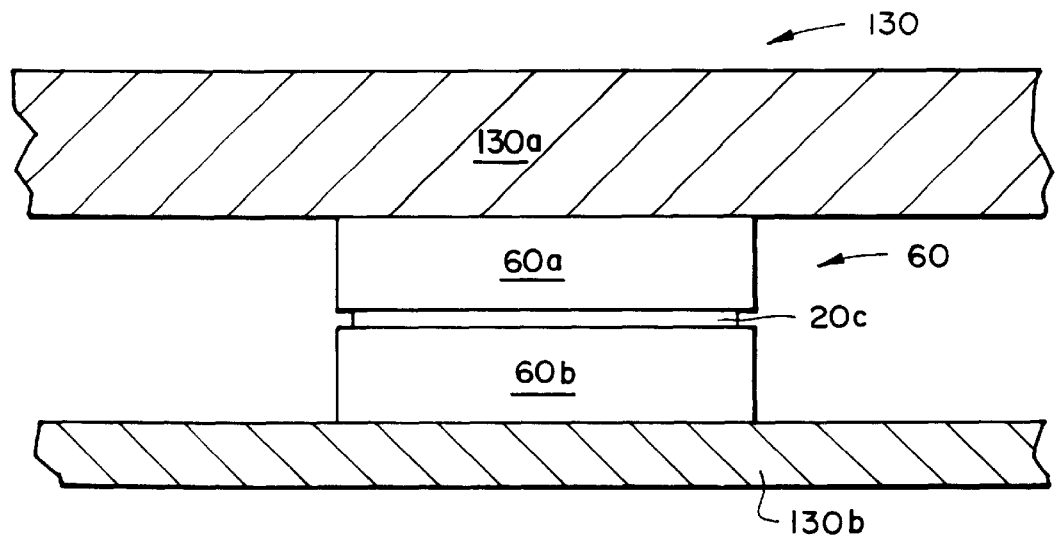
Figure 12:
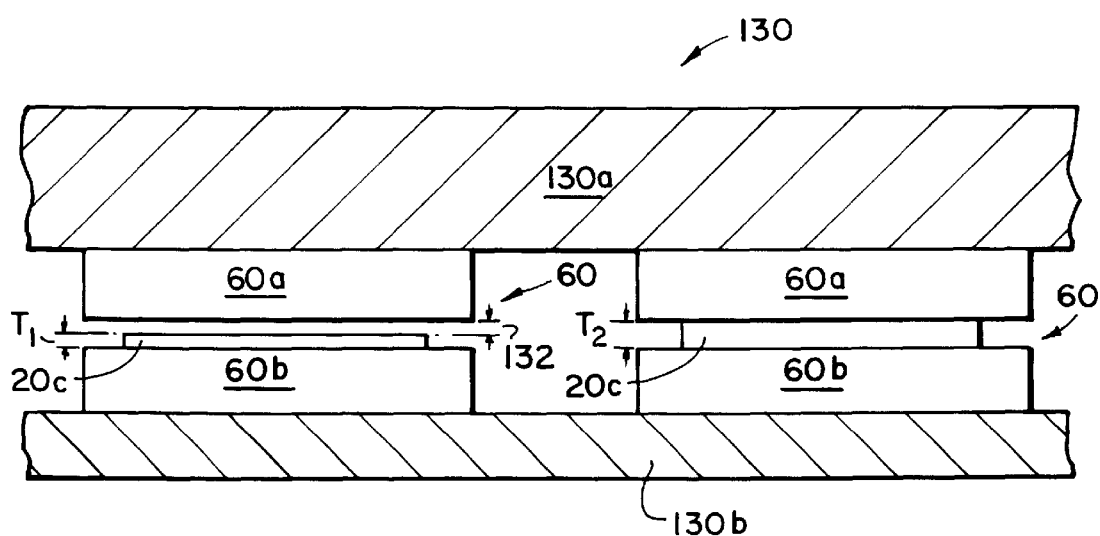

FIGS. 11 and 12 are cross-sectional side views of a press.

Figure 13B:
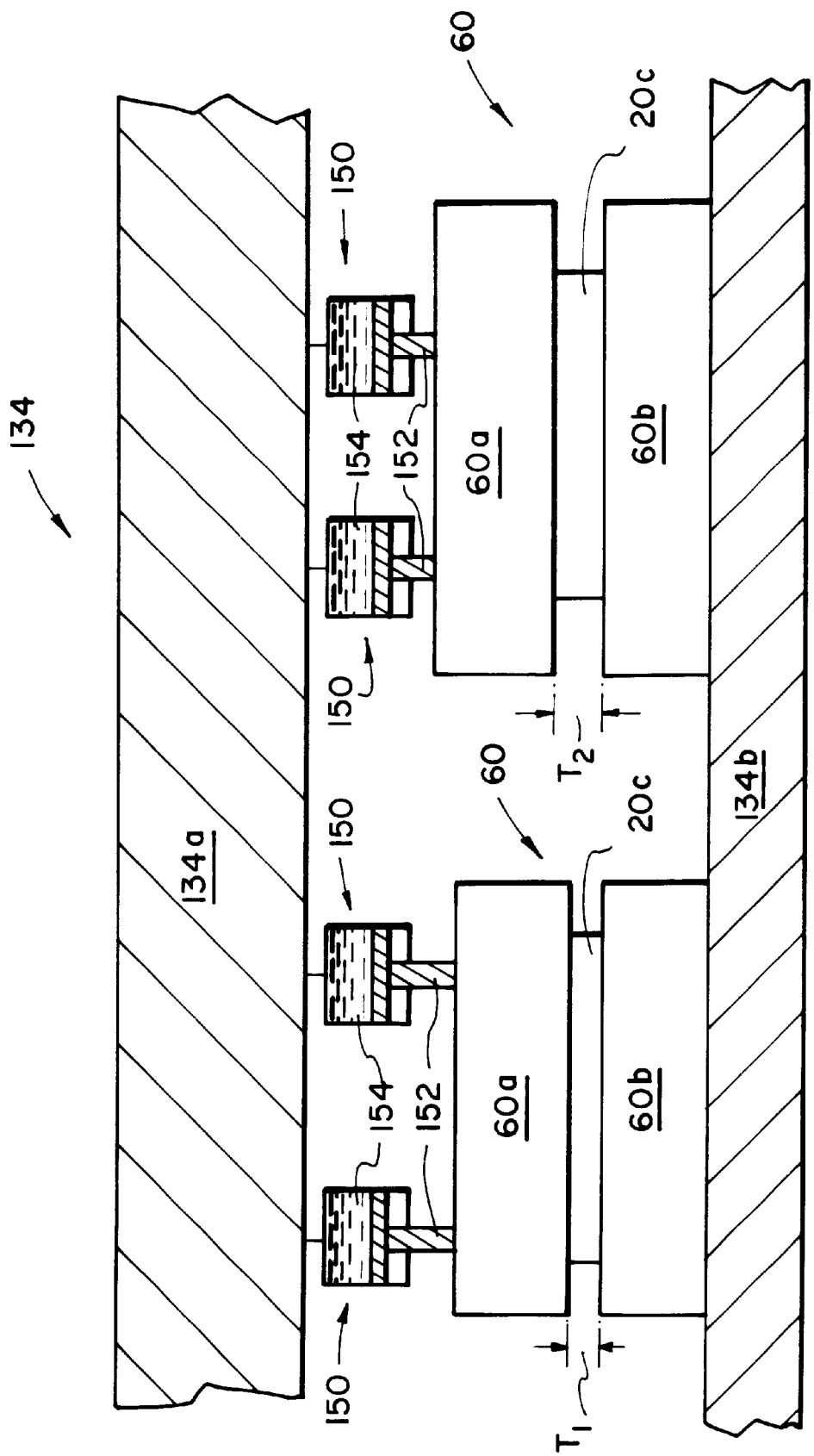
Figure 13C:
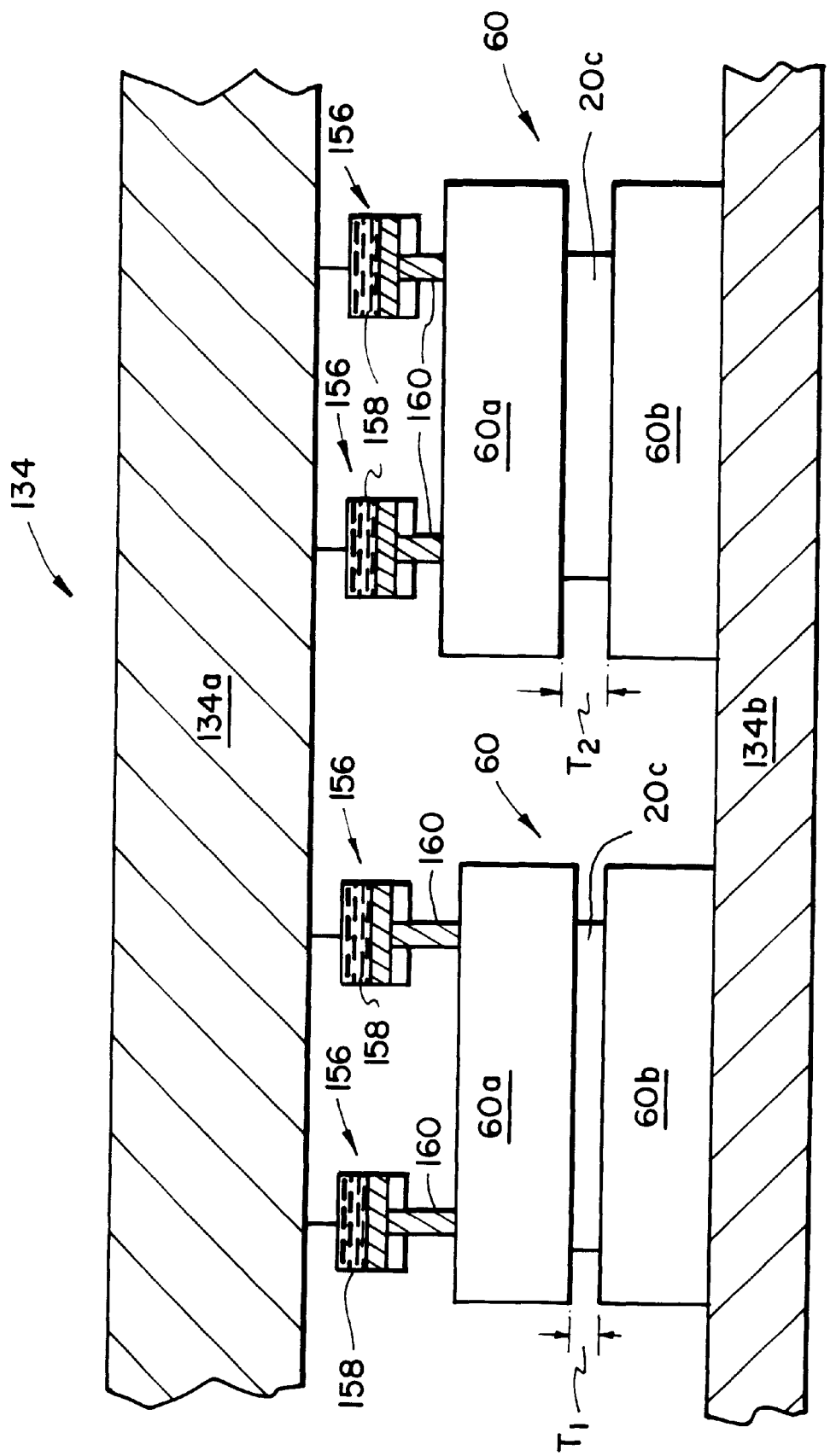

FIGS. 13a, 13b, and 13c are cross-sectional side views of presses including compliance mechanisms attached to molds.

Figure 14:
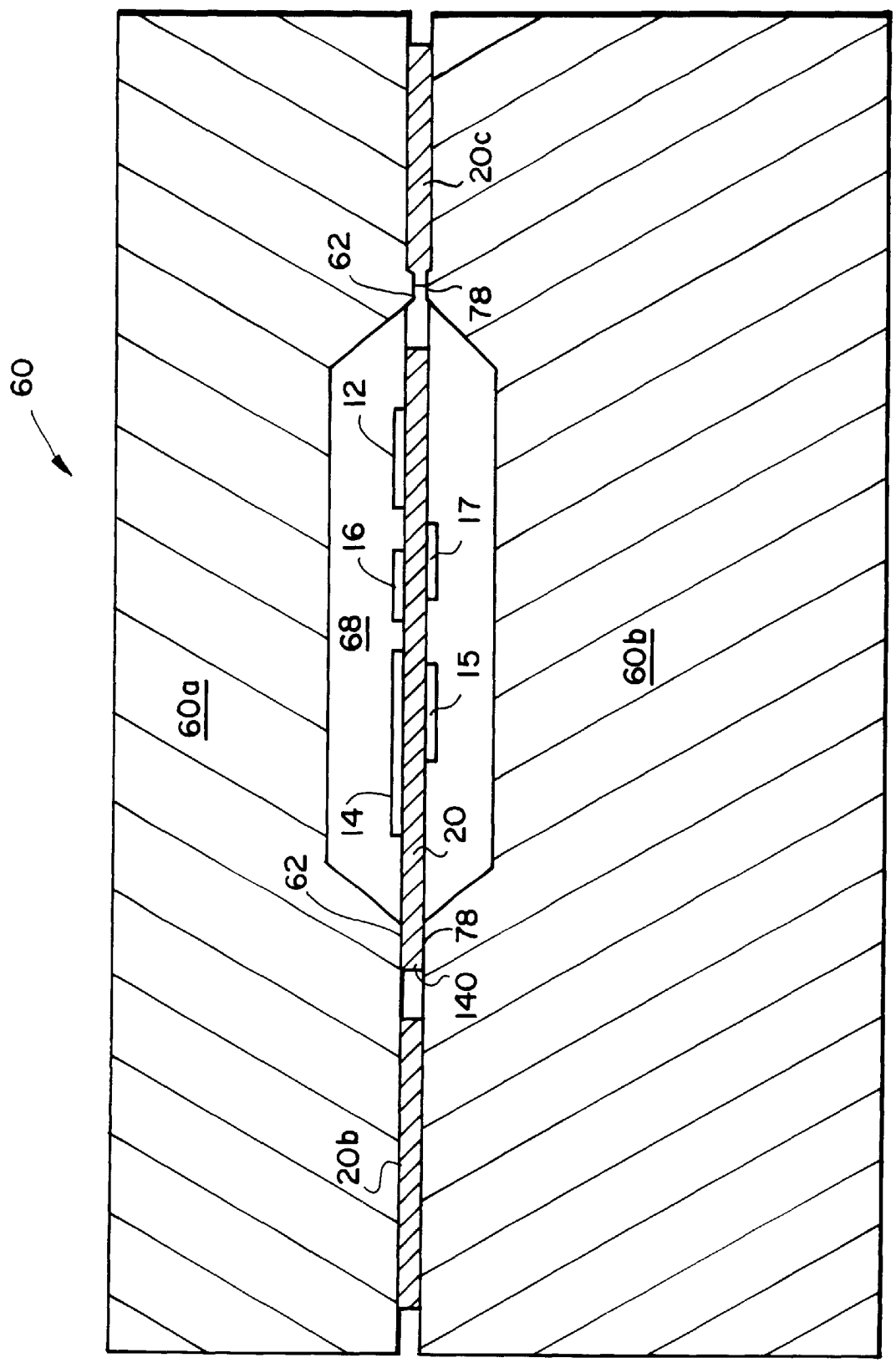
Figure 15:
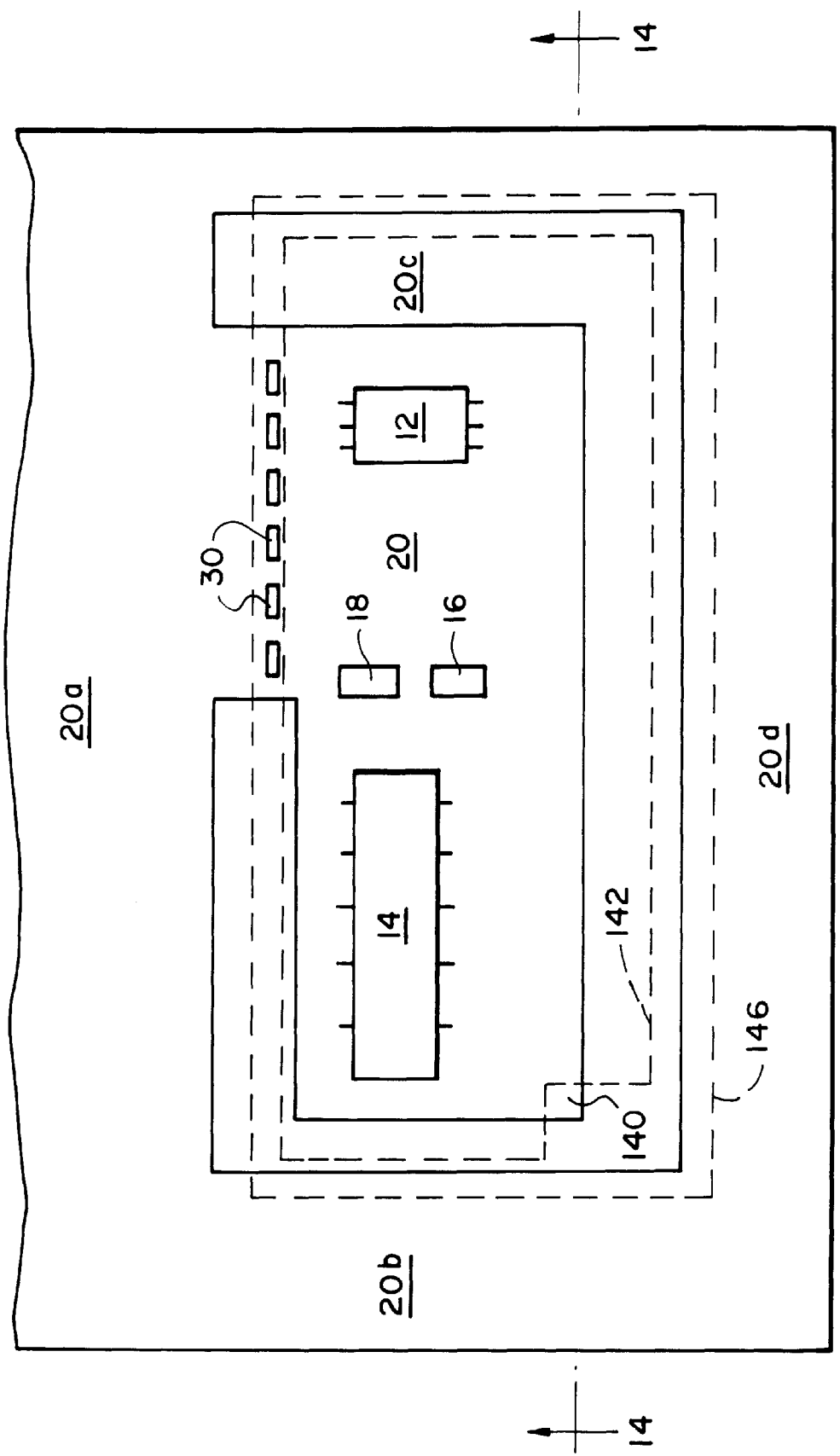

FIG. 14 is a cross-sectional side view of the circuit of FIG. 15 within a mold.

FIG. 15 is plan view showing a circuit.

Figure 16:
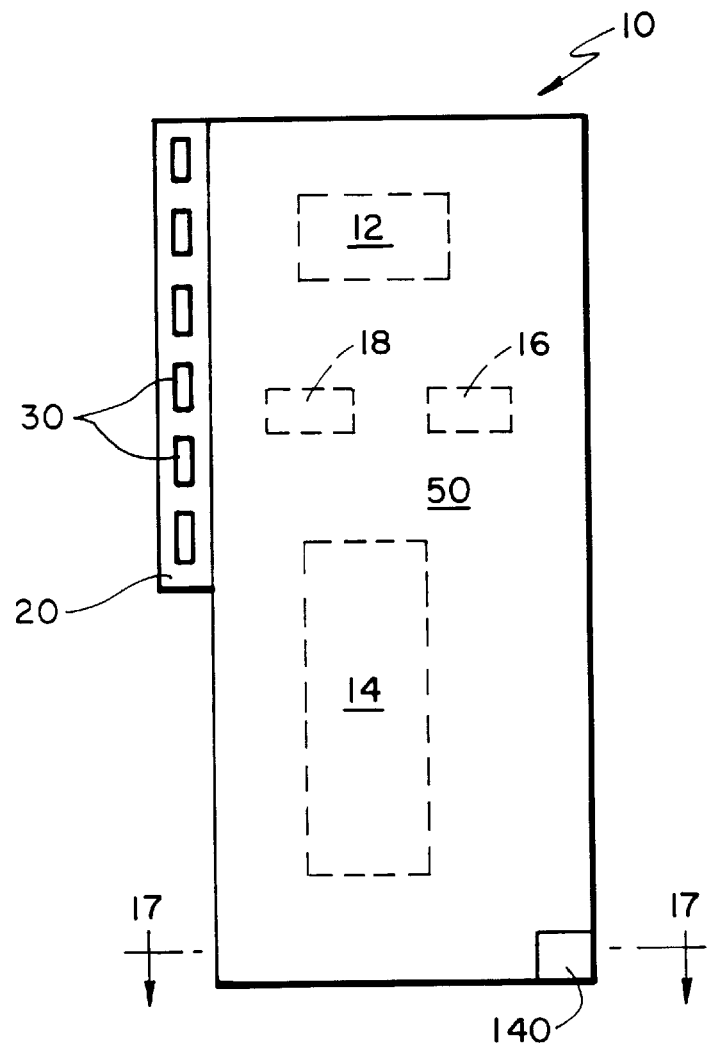

FIG. 16 is a plan showing the circuit of FIG. 15 partially encapsulated.

Figure 17:
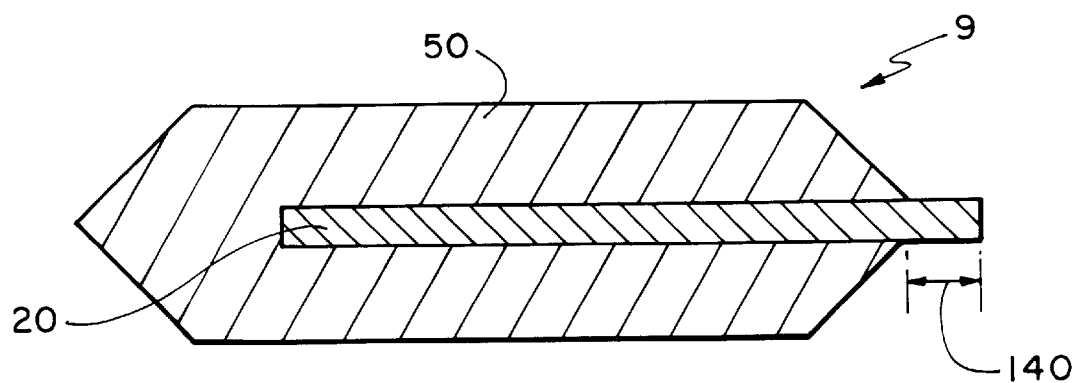

FIG. 17 is a cross-sectional side view of the structure of FIG. 16.

Figure 18:
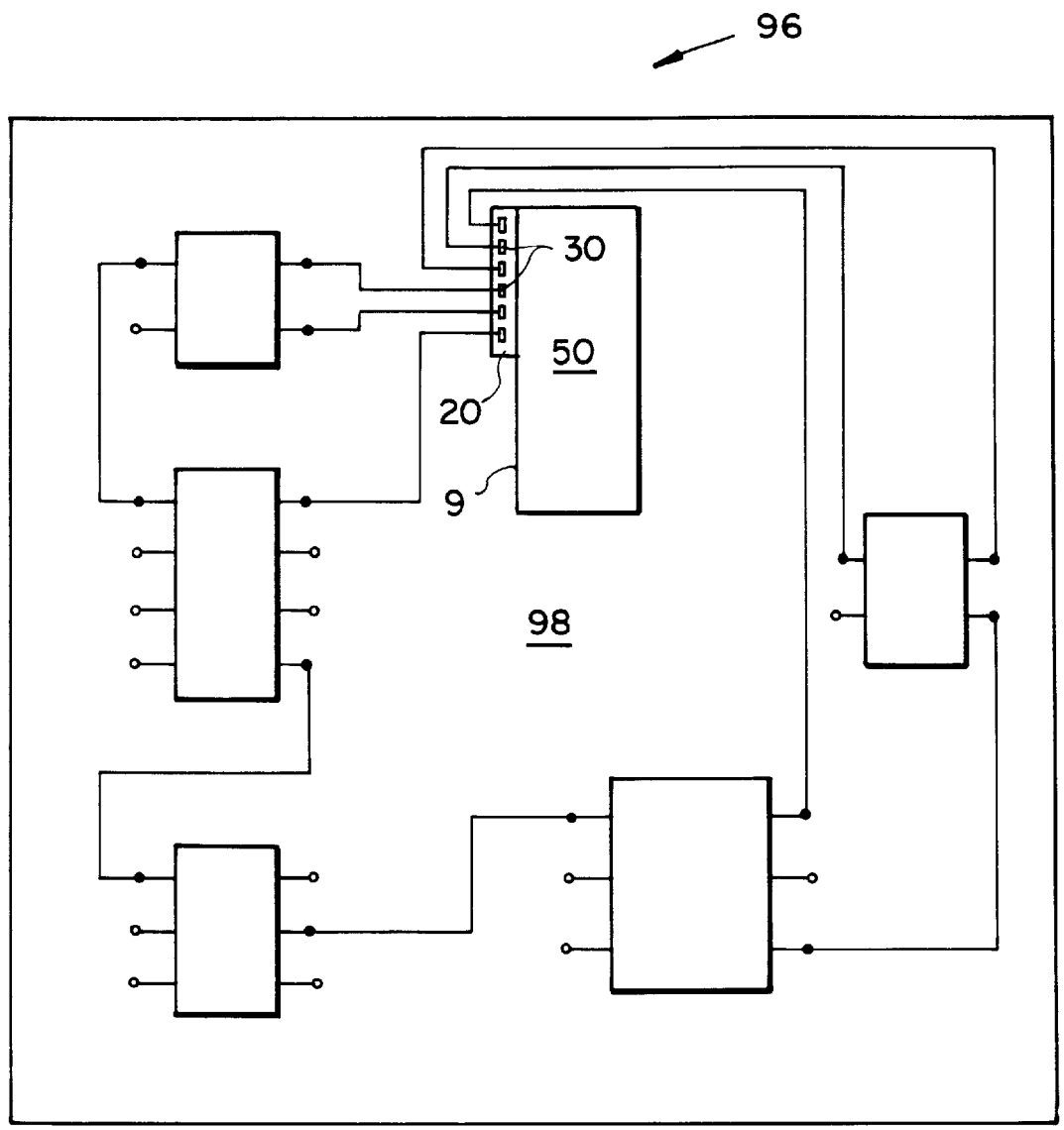

FIG. 18 is a plan of a larger circuit including the circuit of FIG. 4.

Figure 19:
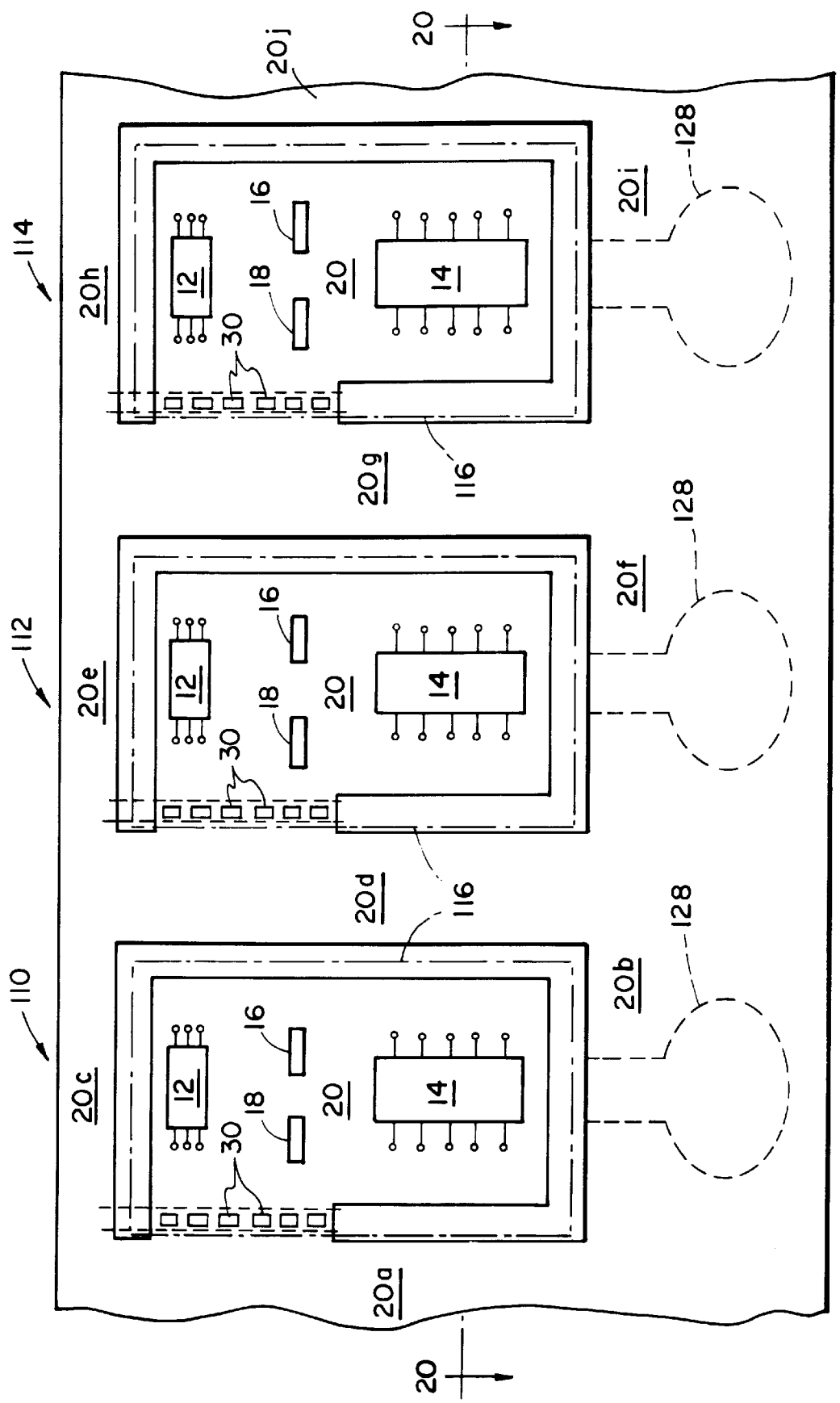

FIG. 19 is a plan of a substrate including three unencapsulated circuits.

Figure 20:
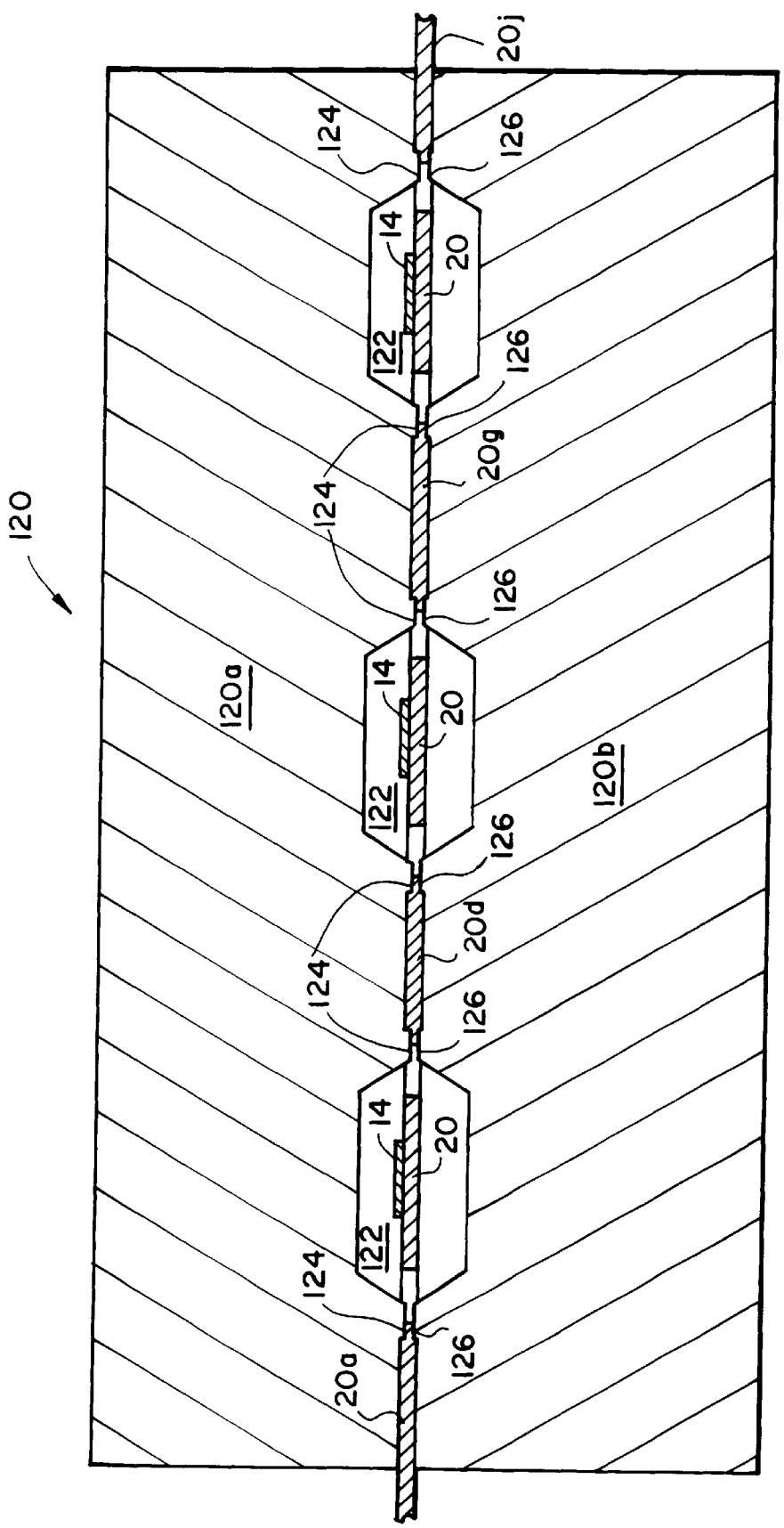

FIG. 20 is a cross-sectional side view of the substrate of FIG. 19 inserted within a mold.

Figure 21:
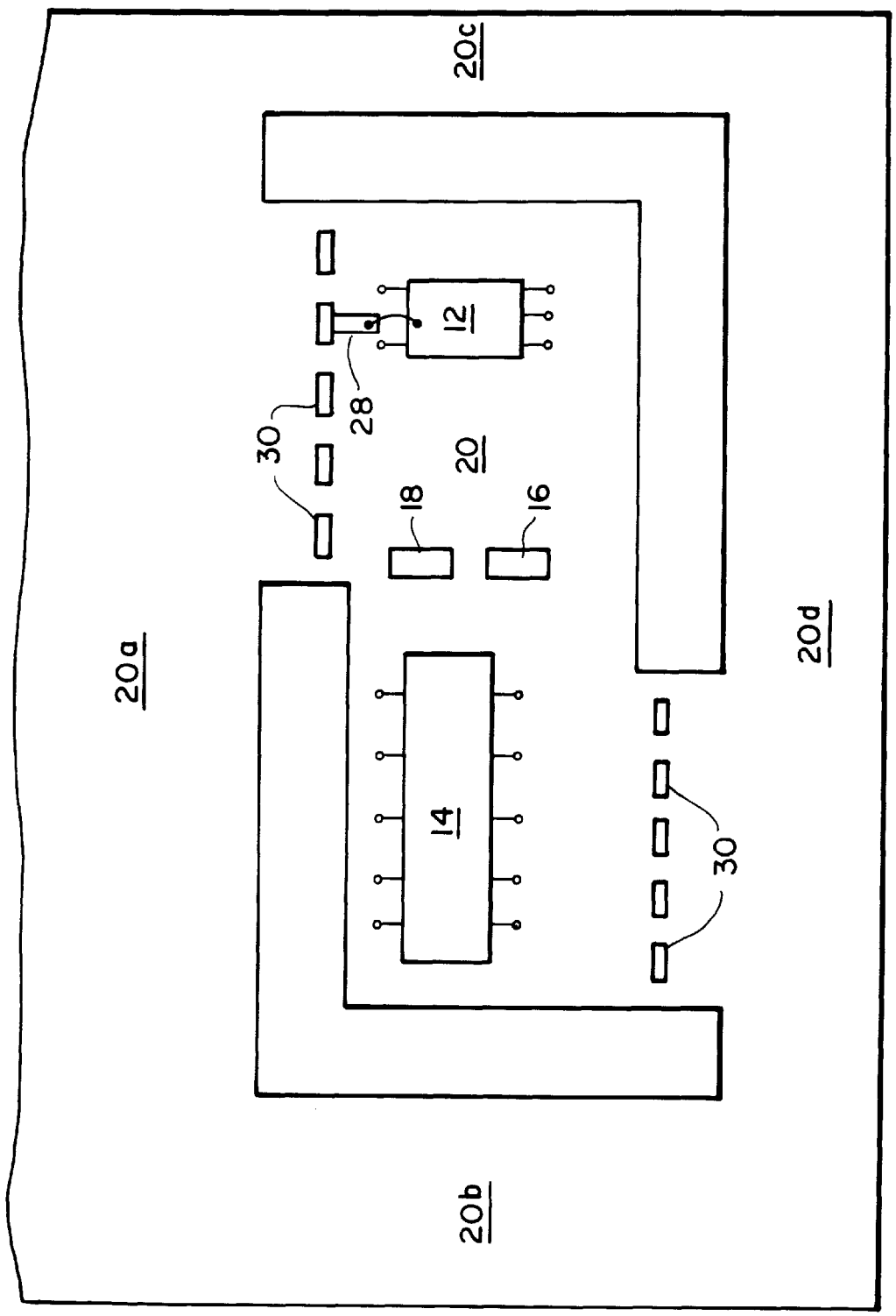
Figure 22:
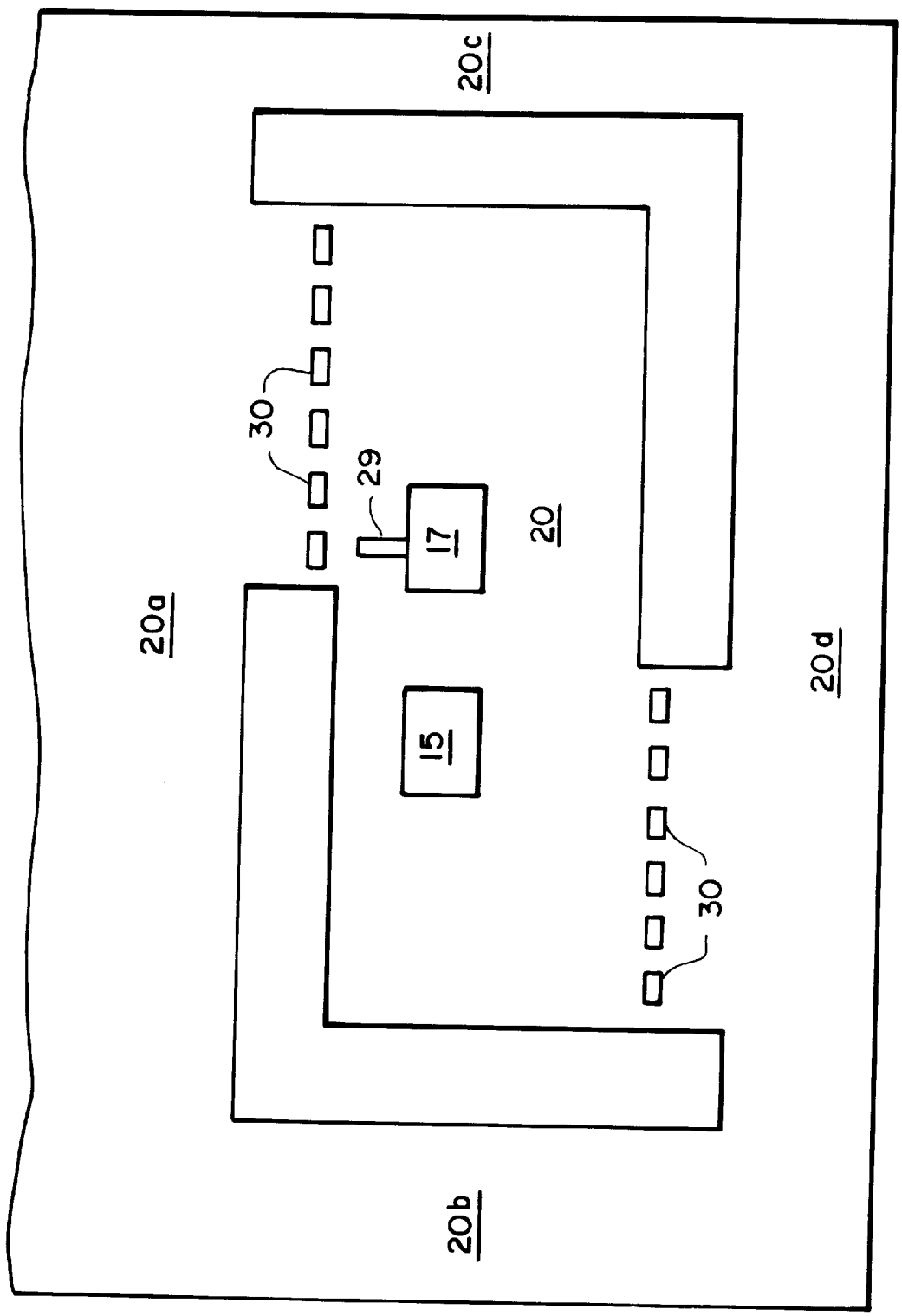

FIGS. 21 and 22 are top and bottom plan views, respectively, of a substrate showing a circuit having four areas with conductive pads.

Figure 23:
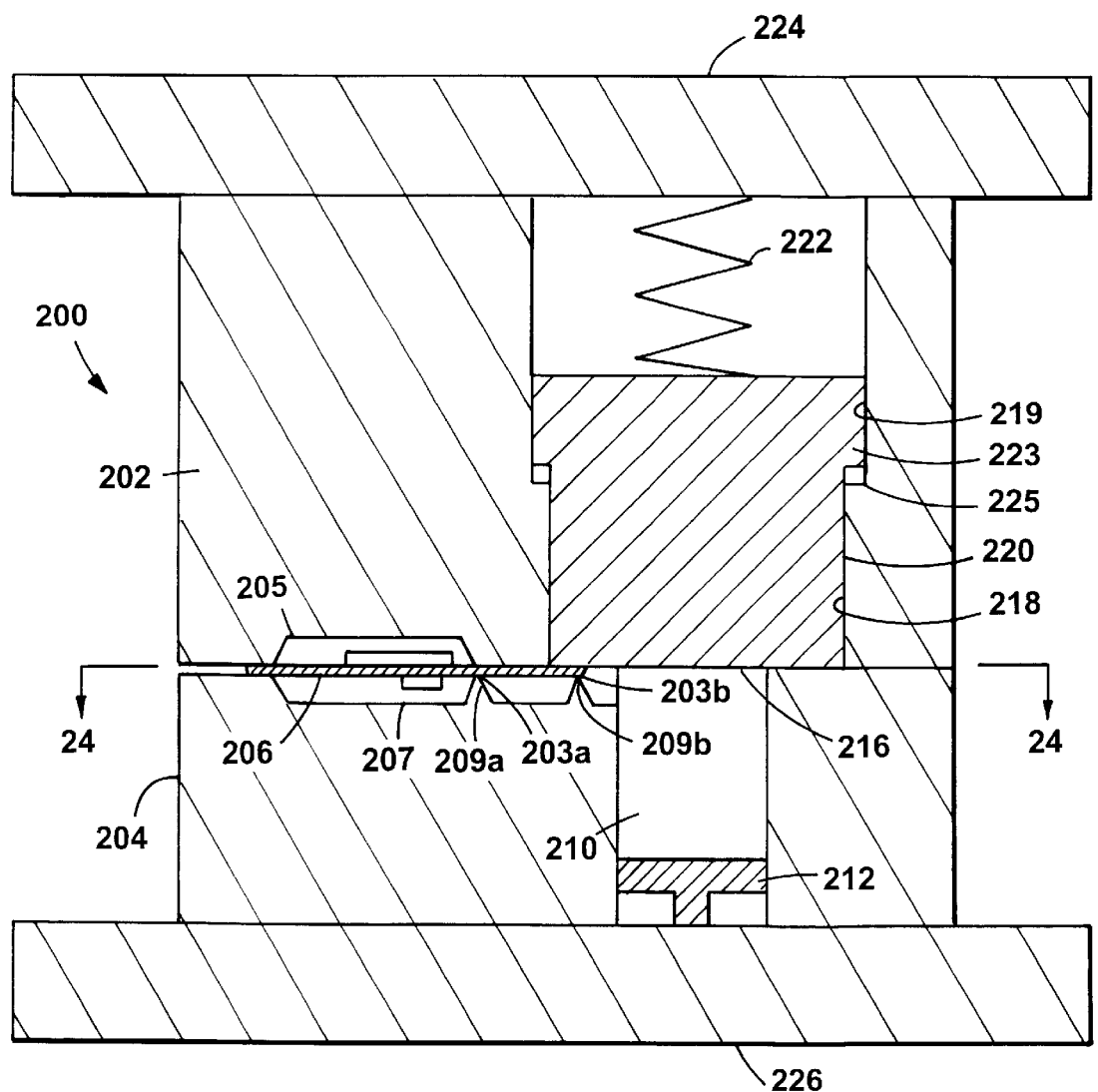

FIG. 23 is a cross-sectional view of a mold.

Figure 24:
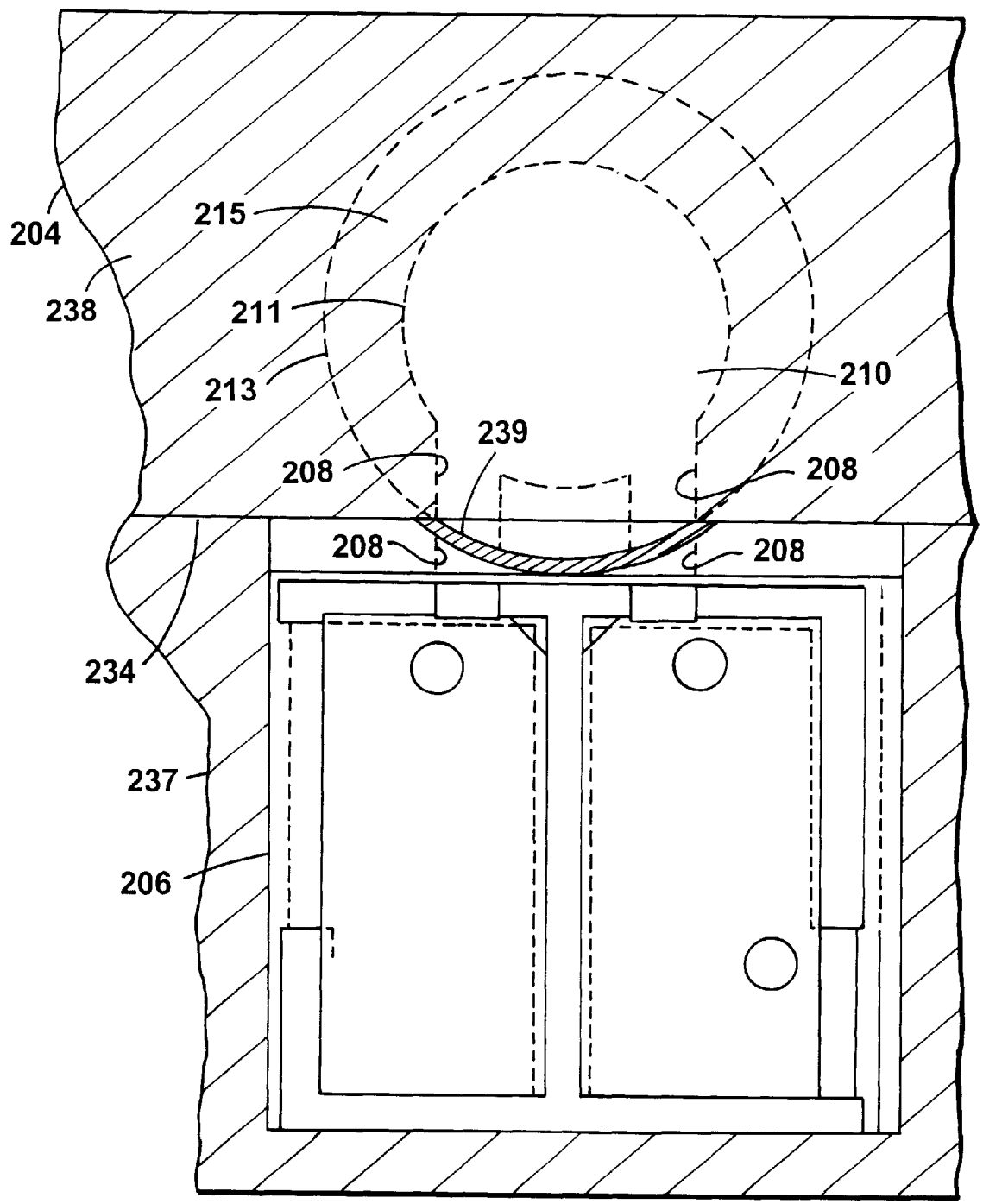

FIG. 24 is a cross-sectional view taken along lines 24—24 of FIG. 23.

Figures 25, 26, 27:
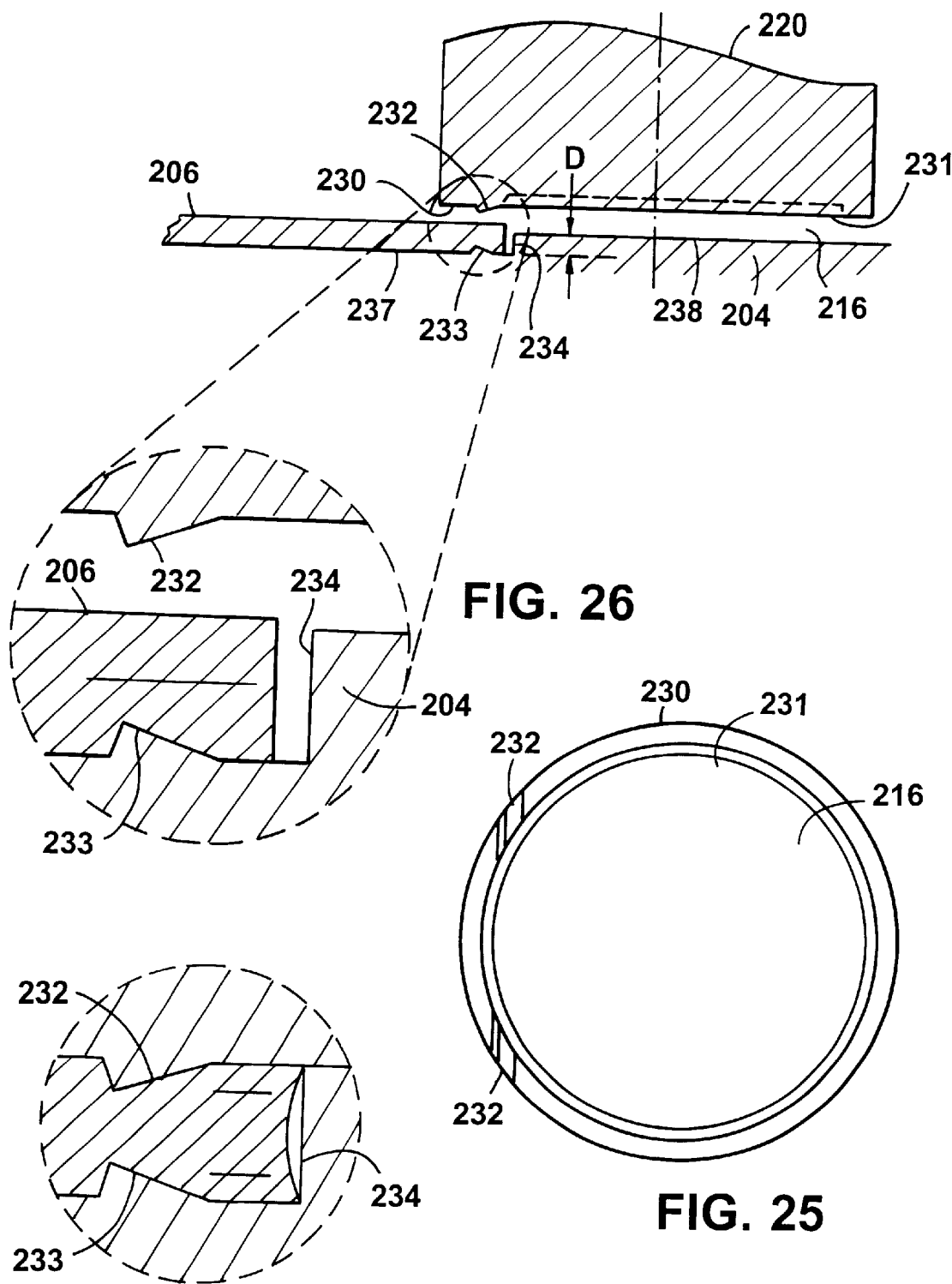

FIG. 25 is a bottom view of the piston of FIG. 23.

FIGS. 26 and 27 are detailed views of the region of contact between a printed circuit board and the piston.

Figure 1A:
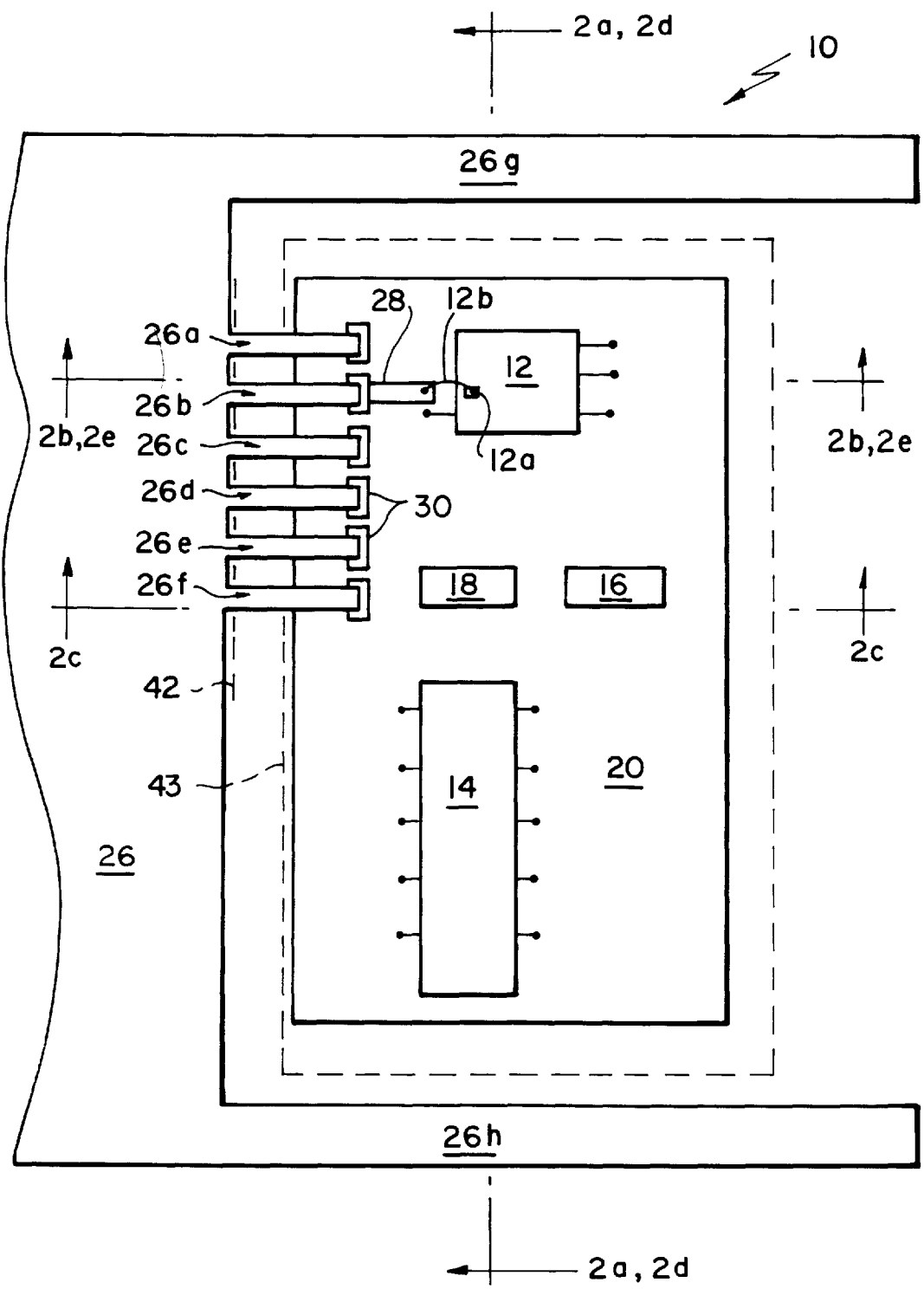
Figure 1B:
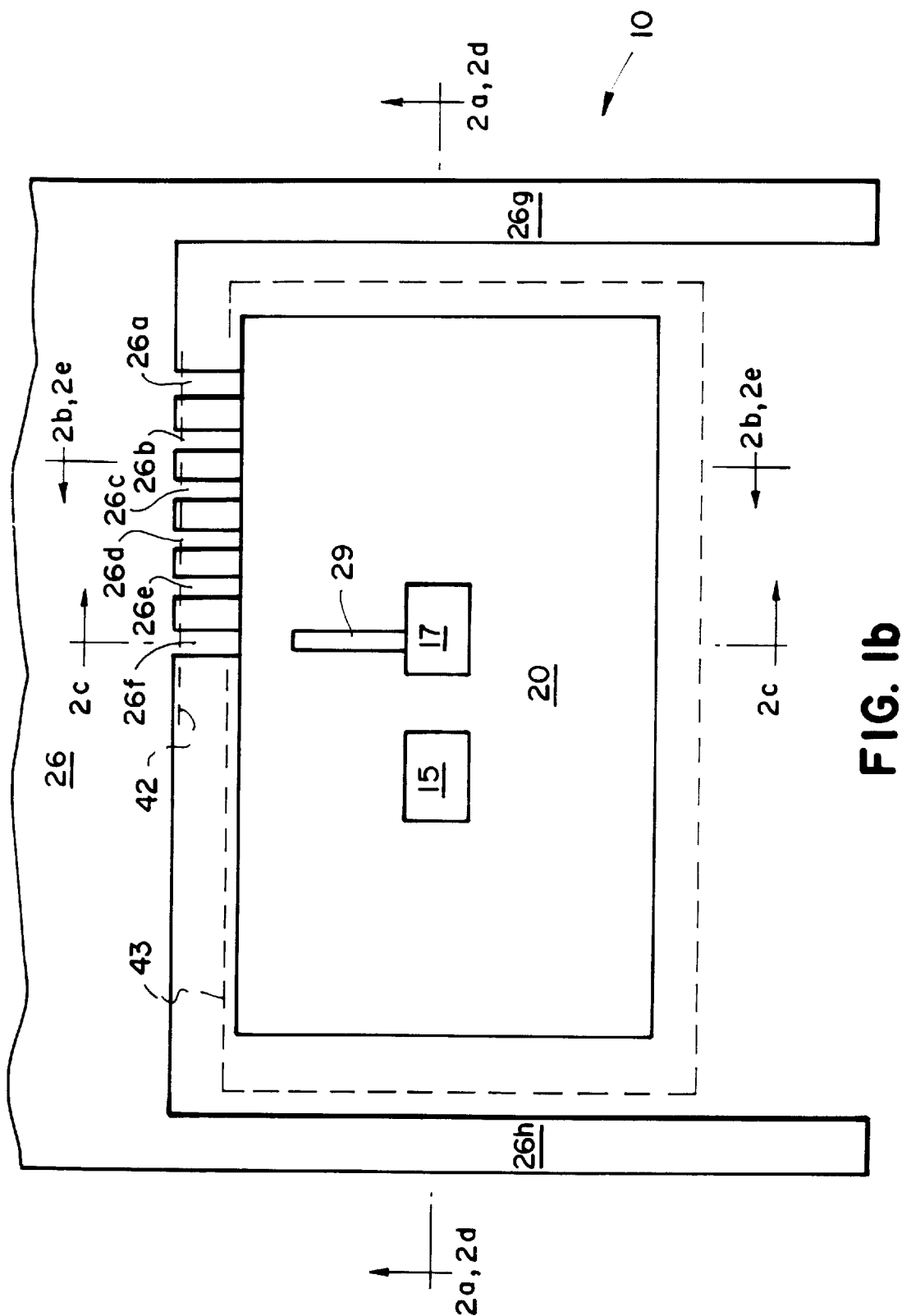

Referring to FIGS. 4, 5a, and 5b, a component 9 includes a circuit 10, having electrical components 12, 14, 15, 16, 17, and 18 mounted on both sides of printed circuit board (PCB) 20, that is only partially encapsulated in cured molding compound 50. Input/Output (I/O) pads 30, located on a portion 52 of PCB 20, are exposed (i.e., not encapsulated). This reduces the size of component 9 by allowing connections to be made directly with I/O pads 30 (i.e., without leads 26a, 26b, 26c, 26d, 26e, and 26f, FIGS. 1a, 1b). The size of component 9 is also reduced by having components mounted on both sides of PCB 20.

For clarity, only conductive leads 28 and 29 of PCB 20 are shown. Wire 12b connects conductive pad 12a of semiconductor die 12 to conductive lead 28 which is connected to an I/O pad 30 (FIGS. 5a, 6a, 8a). A conductive pad (not shown) on a bottom side of component 17 is connected to conductive lead 29 which is connected to an I/O pad 30 through a plated through hole 31 (FIGS. 5b, 6b, 8b).

In order to provide component 9 as shown in FIGS. 4, 5a, and 5b, unencapsulated circuit 10 is inserted into a mold 60, shown in FIGS. 7–10. Referring to FIGS. 6a, 6b, instead of a lead frame 26 (FIGS. 1a, 1b), unencapsulated circuit 10 has PCB waste portions 20a, 20b, 20c, and 20d.

As shown in FIGS. 7–10, a top 60a of a mold 60 has a ridge 62 that extends, in a direction $T_{tr}$ (FIG. 10), for example, approximately 0.001 inches, above a surface 64 of top 60a and surrounds a cavity 68a within top 60a (FIGS. 8a, 8b). When the top 60a and a bottom 60b of mold 60 are closed around circuit 10, ridge 62 pushes down (arrows 70, FIGS. 7, 8a, 8b) onto waste portions 20b, 20c, and 20d (along dashed line 72, FIG. 6a) and down (arrows 74, FIGS. 8a, 8b) onto the area between PCB 20 and waste portion 20a, including I/O pads 30 (between dashed lines 72, 76, FIG. 6a).

Bottom 60b of mold 60 has a ridge 78 that extends, in a direction $T_{br}$ (FIG. 10), for example, approximately 0.001 inches, above a surface 80 of bottom 60b and around a first part of a cavity 68b within bottom 60b (FIGS. 8a and 8b). Bottom 60b also has a second ridge 82 that forms an end to a runner 84 within bottom 60b that is connected to a pot 86 also within bottom 60b (FIG. 9). Ridge 82 extends around a second part of bottom cavity 68b. When top 60a and bottom 60b of mold 60 are closed around circuit 10, cavities 68a and 68b form cavity 68 and ridge 78 pushes up (arrows 90, FIGS. 7, 8a, 8b) against waste portions 20a, 20c, and 20d (along dashed line 72, FIG. 6b).

Piston 90 (FIGS. 7, 9) is used to push liquid, uncured molding compound 35 from pot 86 into runner 84 and into mold cavity 68 at about 1000 psi.

Figure 2A:
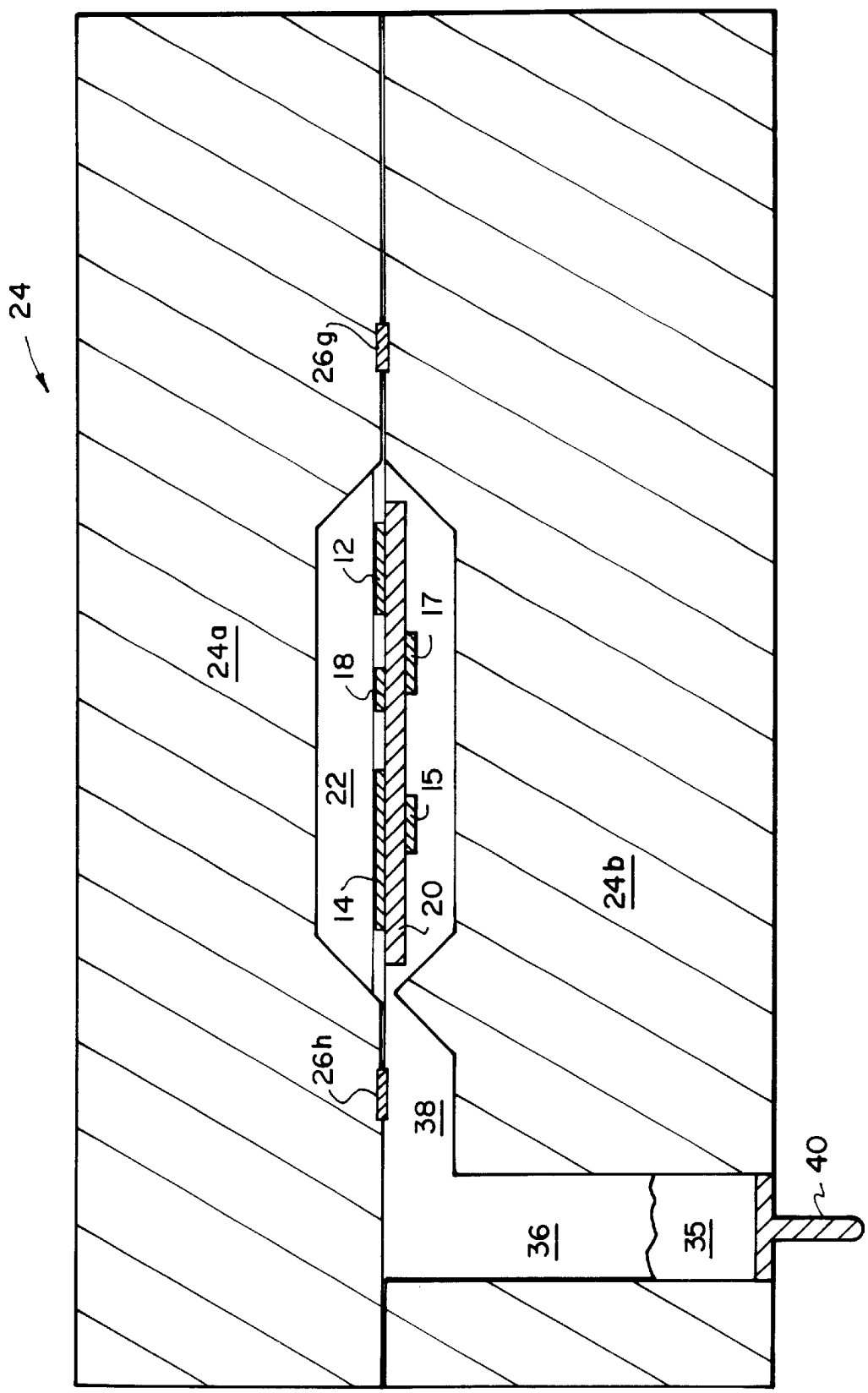
Figure 2C:
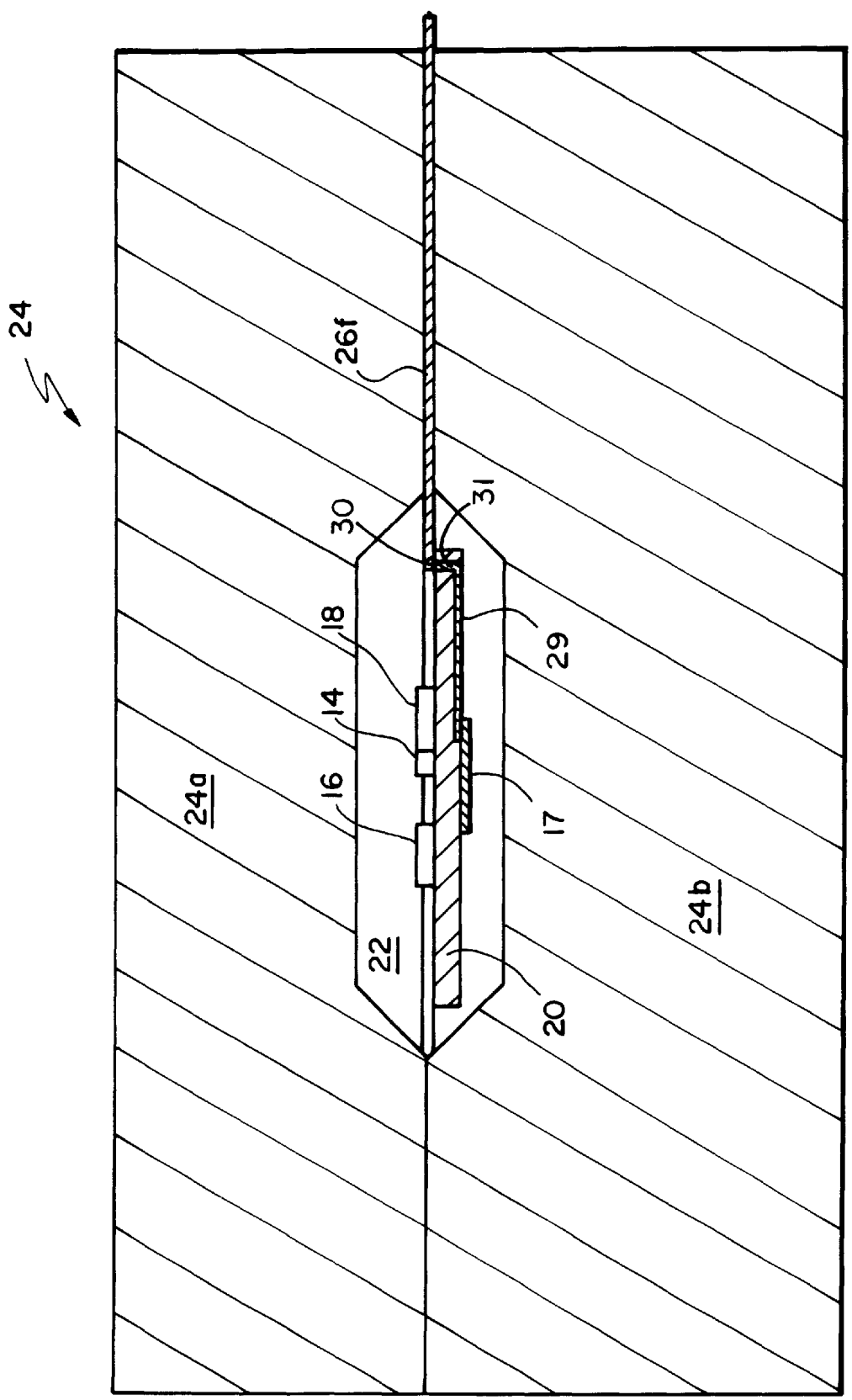
Figure 2D:
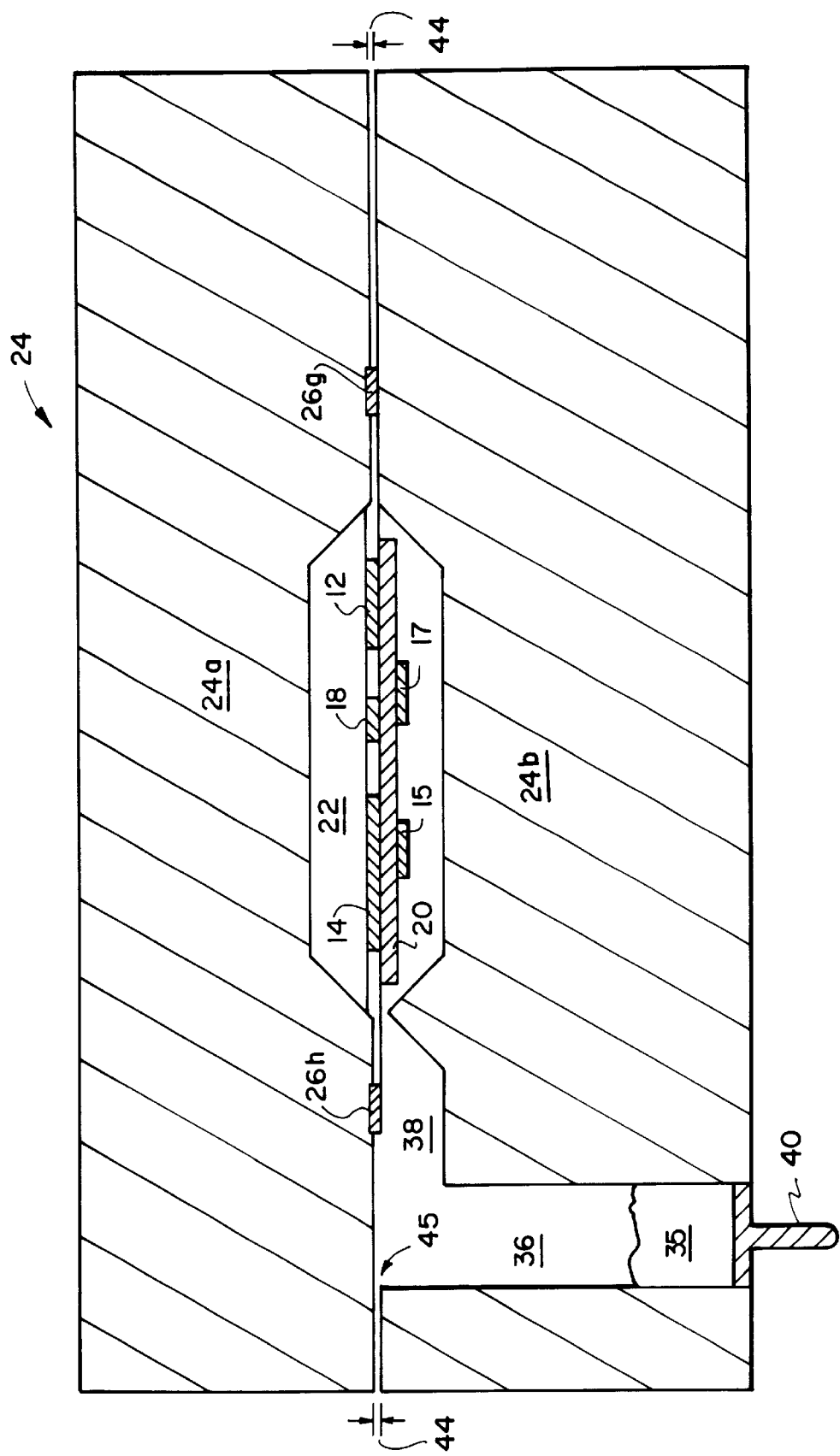
Figure 2E:
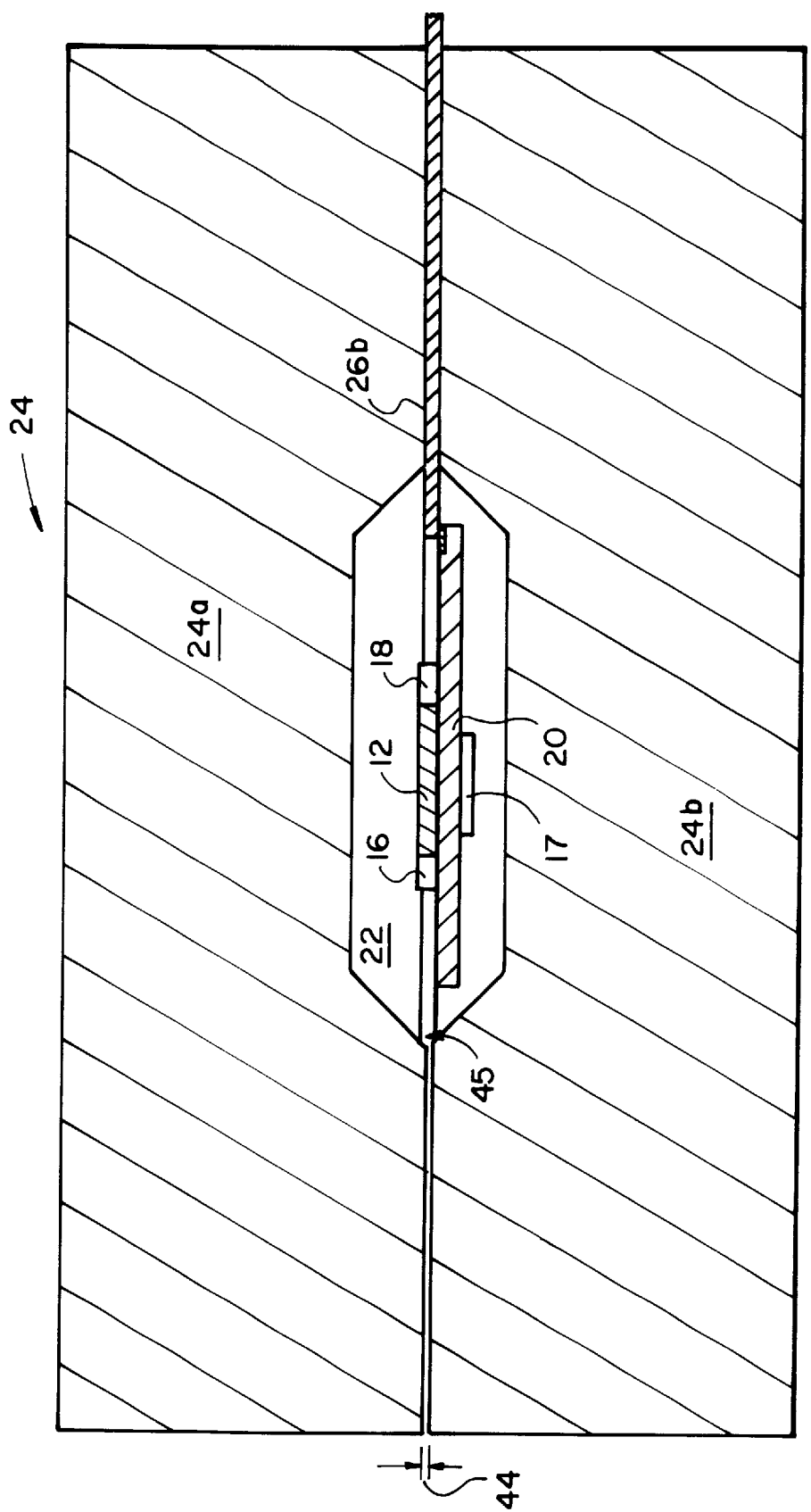

Top 60a and bottom 60b of mold 60 close on printed circuit board on all sides of circuit 10 forming a seal around circuit 10 with the exception of I/O pads 30. A top of pot 86 and runner 84 is defined by PCB waste portion 20b (FIG. 9). As a result, variations in the thickness of the PCB do not cause a gap (gap 44, FIGS. 2d, 2e) through which molding compound 35 can leak.

Ridge 62 of mold top 60a and ridge 78 of mold bottom 60b extend up to a maximum of 0.002 inches into PCB 20 and waste portions 20a, 20b, 20c, and 20d. PCB 20 is compressible, and in the area of I/O pads 30, PCB 20 is not crushed or otherwise permanently damaged by ridges 62 and 78. Ridges 62 and 78 also prevent molding compound from leaking in the direction indicated by arrows 92 (FIGS. 7, 8a, 8b) and "resin bleeding" (i.e., epoxy resin leakage) which can occur with a gap 44 (FIGS. 2d, 2e) of 0.0005 inches or less.

Mold 60 is part of a press 130, shown in FIG. 11. After PCB 20 is inserted into mold cavity 68, a top 130a of press 130 closes mold top 60a on PCB 20 and the waste portions. Press top 130a and bottom 130b hold the mold closed while the molding compound 35 is pushed into mold cavity 68.

Press 130 provides an even profile of pressure across PCB 20 (the edges of waste portions 20c are shown) through mold 60. If two molds 60 are inserted into press 130 and the thickness $T_1$, $T_2$ of each PCB is different (i.e., $T_1$ is less than $T_2$), press 130 will not provide an even profile of pressure across the thinner PCB (i.e., $T_1$), as indicated in FIG. 12 by gap 132.

In order to accommodate multiple molds holding PCBs of different thicknesses, a press 134 is provided (FIG. 13a) with springs 136 attached to each mold top 60a. Springs 136 have a spring constant of approximately 100 Kg per 0.001 inch, and the compliance of the springs allows the press to apply an even pressure across each mold 60 even where the molds hold PCBs of different thicknesses. One or more springs may be attached to each mold top 60a, and instead of springs, hydraulic cylinders 150 filled with high pressure fluid 154 and having pistons 152 (FIG. 13b) or pneumatic cylinders 156 filled with high pressure gas 158 and having pistons 160 (FIG. 13c) can be used.

Referring to FIGS. 14 and 15, to stabilize (i.e., prevent movement of) PCB 20 within mold cavity 68 during encapsulation, the mold can be configured to close on a portion (i.e., in between dashed lines 142, 146 of FIG. 15) 140 of PCB 20 in an area of PCB 20 without pads 30. As a result, portion 140 will not be encapsulated in cured molding compound 50, shown in FIGS. 16 and 17. Ridges 62 and 78 can also be configured to close on multiple portions of PCB 20 in areas of PCB 20 without pads 30.

After molding, component 9 is removed from mold 60, and waste portions 20a, 20b, 20c, and 20d (along with waste, cured molding compound, i.e., cull) are removed by cutting along dashed line 94 (FIGS. 6a, 6b). As shown in FIG. 18, exposed conductive pads 30 of component 9 (cured molding compound 50 surrounds circuit 10) are then used to connect circuit 10 into a larger circuit 96 on a PCB 98. Cured molding compound 50 also serves as an electrical insulator providing a high voltage breakdown and, thus, allowing component 9 to be placed in close proximity to other electrical components.

Referring to FIG. 19, several circuits 110, 112, 114 (with similar electrical components 12, 14, 16, and 18 (15 and 17 are included but not shown) connected through similar PCBs 20) can be molded simultaneously. Each circuit has conductive pads 30 through which electrical connections can be made to the components 12, 14, 15, 16, 17, and 18 (only conductive lead 29 is shown for clarity). PCB waste portions 20a, 20b, 20c, 20d, 20e, 20f, 20g, 20h, 20i, and 20j connect the circuits and are cut away along dashed lines 116, after molding, to provide encapsulated circuits with exposed conductive pads 30.

As shown in FIG. 20, mold 120 has a cavity 122 for each circuit. Ridges 124 of mold top 80a surround each circuit, by extending down against waste portions 20b, 20c, 20d, 20e, 20f, 20g, 20h, 20i, and 20j and by extending down against the areas between waste portions 20a, 20d, and 20g and PCB 20, including I/O pads 30. Similarly, ridges 126 of mold bottom 120b surround each circuit by extending up against waste portions 20b, 20c, 20d, 20e, 20f, 20g, 20h, 20i, and 20j and by extending up against the areas between waste portions 20a, 20d, and 20g and PCB 20, including I/O pads 30. As a result, ridges 124 and 126 form a seal around PCBs 20. The bottom side of waste portions 20b, 20f, and 20i define tops of runners and pots indicated by dashed lines 128 in FIG. 19. Molding is accomplished as described above with reference to FIGS. 7–10 and 13.

PCB's thickness can vary as much as 0.002 inches from waste portion 20a to waste portion 20j. Hence, conventionally molding several circuits simultaneously is difficult because although the mold may apply the proper pressure and not form a gap 44 (FIGS. 2d, 2e) at one end of the PCB, it may not apply the proper pressure or form a gap 44 at the opposite end of the PCB. The variation in the thickness of the PCB is accommodated for in mold 120 (FIG. 20) by ridges 62 and 78. In areas where the PCB is thickest, ridges 62 and 78 compress the PCB approximately 0.002 inches. In areas where the PCB is the thinnest, ridges 62 and 78 close against, but do not compress the PCB. As a result, no gap is created through which molding compound can leak out of mold 120.

Many different circuit shapes can be molded in this way, and the printed circuit boards may have only one area where conductive pads are mounted or multiple areas (FIG. 21) where conductive I/O pads 30 are mounted. The conductive pads may also be mounted on both sides of the PCB (FIG. 22).

Similarly, a variety of compliant and non-compliant substrates can be used instead of PCB 20 and waste portions 20a, 20b, 20c, and 20d, shown in FIGS. 6a, 6b. A non-compliant substrate such as ceramic, for example, could be used. Where non-compliant substrates are used, mold top 60a and mold bottom 60b (FIGS. 7–10) would not include ridges 62, 78, respectively. Instead, surfaces 64 and 80 of mold top 60a and bottom 60b, respectively, would close flush against the non-compliant substrate.

As shown in FIG. 23, in another scheme, a different mold 200 may be used to encapsulate circuits on a printed circuit board (PCB) 206. The mold 200 has a top mold section 202 which closes on the top of the PCB 206 and a bottom mold section 204 which closes on the bottom of the PCB 206. The mold sections 202 and 204 are held together to form the mold 200 by two mold presses 224 and 226. Because the sections 202 and 204 close on opposite sides of the PCB 206 (i.e., the sections 202 do not contact each other to form the seal of the mold 200), variations (e.g., +/−0.0025 inches) in the thickness of the PCB 206 do not affect the seal integrity of the mold 200.

The PCB 206 does not cover all exposed cavities of the bottom mold section 204. The bottom mold section 204 has a molding compound injection cylinder, or pot 210, that is neither closed by the top mold section 202 nor by the PCB 206 (i.e., the pot 210 is exposed). For purposes of closing the pot 210 where it is exposed, a spring-loaded cylindrical piston 220 is slidably mounted inside a cylinder 218 formed in the top mold section 202. When the mold sections 202 and 204 are assembled on the PCB 206, a spring 222 forces the piston 220 downwardly to close the pot 210 where the pot 210 is exposed. To prevent the piston 220 from dropping out of the mold section 202 when the mold 200 is not assembled, the piston 220 has an annular extension 223 that slides within a cylinder 219 of the mold section 202. The cylinder 219 is coaxial with and has a larger diameter than the cylinder 218. A shoulder 225 is formed where the two cylinders 218 and 219 meet. The shoulder 225 serves as a stop to limit the translational freedom of the extension 223 and thus, the piston 220.

The conduit 210 provides a channel for delivering the molding compound to internal cavities 205 and 207 of the mold 200. Exposed channels, or runners 208 (one for each encapsulated circuit), formed in the bottom section 204 direct the molding compound from the pot 210 into the top mold cavity 205 (formed in the top mold section 202) and the bottom mold cavity 207 (formed in the bottom mold section 204). Each otherwise exposed runner 208 is partially covered by the PCB 206 and partially covered by the piston 220. At the end of each runner 208 farthest from the pot 210 is an inclined ridge 209a which extends upwardly toward the PCB 206 and creates a narrow injection point 203a at the entrance of the bottom mold cavity 207. Another inclined ridge 209b extends upwardly from the runner 208 to create another narrow injection point 203b where the pot 210 and runner 208 meet. To force the molding compound into the cavities 205 and 207, a piston 212 is slidably mounted inside the pot 210 and is used to force the molding compound from the pot 210 into the bottom cavity 207. The molding compound flows into the top cavity 205 via holes in the PCB 206.

As shown in FIG. 24, the piston 220 closes on, or contacts, the bottom mold section 204, forming a metal-to-metal seal over an annular area 215 between the outer perimeter 213 of the piston 220 and the outer perimeter 211 of the pot 210. Thus, the piston 220 closes part of the exposed runners 208. For purposes of sealing off the annular space between the piston 220 and the top section 202 (over the runners 208), the PCB 206 extends beyond the mold cavities 205 and 207 and is located beneath this annular space. The piston 220 crushes an arcuate region 239 of the PCB 206 where the PCB 206 extends under the piston 220. The crushed PCB forms a seal between the piston 220, the top mold section 202, and the PCB 206. The crushing of the PCB 206 by the piston 220 removes any thickness variation of the PCB 206.

As shown in FIG. 25, a face 216 of the piston 220 (used for closing the conduit 210 and crushing the PCB 206) has an annular downwardly extending rim 230 which forms the arcuate region 239. As shown in FIG. 26, the bottom mold section 204 has a lower region, or depression 237, for holding the PCB 206 and a higher region 238 for forming the metal-to-metal seal with the piston 210. A shoulder 234 separates the depression 237 and the higher region 238. A distance D between the top surface of the depression 237 and the top surface of the region 238 (i.e., the height of the shoulder 234) is equal to the minimum potential thickness of the PCB 206. The rim 230 crushes the PCB 206 such that the top surface of the crushed region 239 of the PCB 206 is substantially flush with the top surface of the region 238.

For purposes of forcing an edge of the PCB 206 against the shoulder 234 to form a tight seal between the PCB 206 and the bottom mold section 204, the face 216 has two downwardly extending asymmetric knives 232. The knives 232 are aligned with two asymmetric knives 233 which upwardly extend from the depression 237. As shown in FIG. 27, when the piston 220 exerts force on the PCB 206, the edge of the PCB 206 is forced against the shoulder 234 by the contact of the PCB 206 with the knives 232.

Other embodiments are within the scope of the following claims. For example, one or more of the knives may be symmetric instead of asymmetric.

What is claimed is:

1. A method for encapsulating a circuit on a circuit board, comprising:
    closing a first mold section on one side of the board, the first mold section having an exposed cylinder;
    closing a second mold section on another side of the board, the second mold section having a conduit for pushing molding compound into a mold cavity in at least one of the mold sections, the conduit having a exposed portion opened to the exposed cylinder when the first and second mold sections are closed on the circuit board; and
    extending a piston through the exposed cylinder to close and form a seal around the exposed portion of the conduit.

2. The method of claim 1, wherein the board partially extends over the exposed portion of the conduit, further comprising:
    crushing a portion of the board extending over the exposed portion of the conduit.

3. The method of claim 1, further comprising:
    using the piston to exert lateral forces on the board to seat the board within the second mold section.

4. The method of claim 1 further comprising:
    extending a second piston through the conduit to push molding compound into the cavity.

5. A method for encapsulating portions of an object comprising:
    forming a mold cavity around the portions to be encapsulated by closing a mold on the object;
    the mold comprises a first face and a second face, the first and second faces mating when the mold is closed;
    the mold having a conduit located in the first face for pushing molding compound into the cavity and an open portion of the conduit comprises a separation between the first face and the second face caused by a thickness of the object;
    providing an extension of the object that protrudes over the conduit in the open portion;
    engaging the extension of the object with the sealing member; and
    forming a seal around the open portion of the conduit by moving a sealing member movably mounted in the mold to seal the periphery of the open portion to accommodate variations in thickness of the object.

6. The method of claim 5 further comprising:
    pushing molding compound through the conduit into the cavity by moving a second member in said conduit.

7. The method of claim 5 further comprising:
    compressing the extension of the object with the sealing member.

8. The method of claim 7 further comprising:
    crushing a portion of the extension with a rim formed on a face of the sealing member.

9. The method of claim 8 further comprising:
    providing an depression in the mold for receiving the object;
    seating the object against an end stop of the depression using the sealing member.

10. The method of claim 9 further comprising providing a knife extending from a face of the sealing member and configured to exert force on the object to seat the object.

11. The method of claim 9 further comprising providing a knife extending from a face of the depression and configured to exert force on the object to seat the object.

12. The method of claim 6 wherein
    the sealing member comprises a piston located in the second face and the second member comprises a piston located in first face.

13. The method of claim 5 wherein:
    the object comprises a circuit formed on a substrate.

14. A method for encapsulating portions of an object on a substrate having two faces and perimeter sides, comprising
    providing a mold having a cavity area, a reservoir area, and a conduit between the reservoir area and the cavity area;
    inserting the substrate into the mold,
    closing a top of the mold and a bottom of the mold against the substrate in the cavity portion forming a seal surrounding the cavity portion;
    forming a seal surrounding said reservoir area including closing the top of the mold against the bottom of the mold in at least a first portion of the reservoir area to form a first seal in the reservoir area;
    pushing molding compound from the reservoir area into the cavity; and encapsulating, in the molding compound, a first portion of one of the faces of the substrate and a portion of the sides of the substrate, and, during encapsulation, leaving a second portion of the one face of the substrate unencapsulated.

15. The method of claim 14 further comprising closing the top of the mold and the bottom of the mold against the substrate in at least a second portion of the reservoir area to form a second seal in at least said second portion of the reservoir area; and wherein said seal surrounding the reservoir area comprises said first seal and said second seal.

16. The method of claim 15 further comprising compressing the substrate in said second portion to form said second seal.

17. The method of claim 14, 15, or 16 wherein the closing the top of the mold against the bottom of the mold includes moving a member movably mounted in the mold to close a space between the top and bottom of the mold.

18. The method of claim 17 wherein the object comprises a circuit.

19. The method of claim 18 wherein the second portion of the one face bears conductive pads.

\* \* \* \* \*

UNITED STATES PATENT AND TRADEMARK OFFICE
CERTIFICATE OF CORRECTION

PATENT NO.     : 6,403,009 B1
DATED          : June 11, 2002
INVENTOR(S)    : John R. Saxelby, Jr. and Walter R. Hedlund, III It is certified that error appears in the above-identified patent and that said Letters Patent is hereby corrected as shown below:

Title page,
Item [57], ABSTRACT,
Line 9, change "section mold sections" to -- second mold sections --.

Column 2,
Line 51, change "section mold sections" to -- second mold sections --.

Signed and Sealed this

Sixth Day of July, 2004

JON W. DUDAS
*Acting Director of the United States Patent and Trademark Office*